(12) United States Patent
Quddus et al.

(10) Patent No.: US 9,647,080 B2
(45) Date of Patent: *May 9, 2017

(54) SCHOTTKY DEVICE AND METHOD OF MANUFACTURE

(71) Applicant: SEMICONDUCTOR COMPONENTS INDUSTRIES, LLC, Phoenix, AZ (US)

(72) Inventors: Mohammed Tanvir Quddus, Chandler, AZ (US); Mihir Mudholkar, Tempe, AZ (US); Mark Griswold, Gilbert, AZ (US); Ali Salih, Mesa, AZ (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/040,650

(22) Filed: Feb. 10, 2016

(65) Prior Publication Data

US 2016/0172458 A1 Jun. 16, 2016

Related U.S. Application Data

(63) Continuation of application No. 14/181,207, filed on Feb. 14, 2014, now Pat. No. 9,263,598.

(51) Int. Cl.
*H01L 29/00* (2006.01)
*H01L 29/47* (2006.01)
(Continued)

(52) U.S. Cl.
CPC .......... *H01L 29/47* (2013.01); *H01L 21/2236* (2013.01); *H01L 21/26513* (2013.01);
(Continued)

(58) Field of Classification Search
CPC ............ H01L 21/0435; H01L 21/0485; H01L 21/28537; H01L 27/0766; H01L 27/095; H01L 29/0619; H01L 29/47; H01L 29/872
(Continued)

(56) References Cited

U.S. PATENT DOCUMENTS 4,862,229 A * 8/1989 Mundy ................. H01L 29/872
257/484
4,982,260 A 1/1991 Chang et al.
(Continued)

OTHER PUBLICATIONS

Wesley Chih-Wei Hsu, Florin Udrea, Pai-Li Lin,Yih-Yin Lin, Max Chen, Innovative Designs Enable 300-V TMBS with Ultra-low On-state Voltage and Fast Switching Speed, Proceedingsof the 23rd International Symposium on Power Semiconductor Devices & IC's, May 23-26, 2011, pp. 80-83, IEEE, San Diego, CA.

*Primary Examiner* — Tan N Tran
(74) *Attorney, Agent, or Firm* — Rennie William Dover

(57) ABSTRACT

A Schottky device includes a barrier height adjustment layer in a portion of a semiconductor material. In accordance with an embodiment, the Schottky device is formed from a semiconductor material of a first conductivity type which has a barrier height adjustment layer of a second conductivity type that extends from a first major surface of the semiconductor material into the semiconductor material a distance that is less than a zero bias depletion boundary. A Schottky contact is formed in contact with the doped layer.

18 Claims, 12 Drawing Sheets

(51) Int. Cl.
  *H01L 29/66* (2006.01)
  *H01L 29/872* (2006.01)
  *H01L 21/223* (2006.01)
  *H01L 21/265* (2006.01)
  *H01L 21/285* (2006.01)
  *H01L 29/06* (2006.01)
  *H01L 29/78* (2006.01)

(52) U.S. Cl.
  CPC .... *H01L 21/28537* (2013.01); *H01L 29/0615* (2013.01); *H01L 29/66143* (2013.01); *H01L 29/66643* (2013.01); *H01L 29/7839* (2013.01); *H01L 29/872* (2013.01); *H01L 29/8725* (2013.01)

(58) Field of Classification Search
  USPC ............... 257/73, 155, 341, 453, 475, 484; 438/270
  See application file for complete search history.

(56) References Cited

U.S. PATENT DOCUMENTS

| | | |
|---|---|---|
| 5,345,100 A | 9/1994 | Kan et al. |
| 5,365,102 A | 11/1994 | Mehrotra et al. |
| 5,612,567 A | 3/1997 | Baliga |
| 6,078,090 A | 6/2000 | Williams et al. |
| 6,255,692 B1 * | 7/2001 | Huang ............... H01L 29/1095 257/329 |
| 6,537,921 B2 | 3/2003 | Metzler |
| 6,724,039 B1 * | 4/2004 | Blanchard ........... H01L 29/7802 257/328 |
| 7,045,397 B1 | 5/2006 | Yu et al. |
| 8,785,278 B2 * | 7/2014 | Yilmaz ............... H01L 29/4236 257/334 |
| 9,263,598 B2 * | 2/2016 | Quddus ............ H01L 29/66143 |
| 2007/0145429 A1 | 6/2007 | Francis et al. |

* cited by examiner

SCHOTTKY DEVICE AND METHOD OF MANUFACTURE

The present application is a continuation application of U.S. patent application Ser. No. 14/181,207 filed on Feb. 14, 2014, by Mohammed Tanvir Quddus et al., titled "SCHOTTKY DEVICE AND METHOD OF MANUFACTURE" which is hereby incorporated by reference in its entirety, and priority thereto for common subject matter is hereby claimed.

TECHNICAL FIELD

The present invention relates, in general, to semiconductor components and, more particularly, to semiconductor components that include Schottky devices.

BACKGROUND

Semiconductor components such as a Schottky device are well suited for use in high frequency applications because they have short reverse recovery times and low forward voltages, i.e., low losses. Techniques for increasing the breakdown voltage of a Schottky device such as, for example, a Schottky rectifier, have resulted in increases in its forward voltage and reverse leakage currents and a decrease in its switching speed. Since the forward voltage drop of a Schottky rectifier increases significantly with increasing supported breakdown voltage, Schottky rectifiers are generally limited to applications of less than 300 volts. Power rectifiers that improve the forward voltage drop, reverse leakage current, and switching speed of Schottky contact regions have been described in U.S. Pat. No. 4,982,260 issued to Hsueh-Rong Chang on Jan. 1, 1991. Trench-gated Schottky devices for protecting gate oxide from high electric fields and hot carrier generation have been described in U.S. Pat. No. 6,078,090 issued to Richard K. Williams on Jun. 20, 2000. A drawback with these techniques is that they increase the amount of silicon used to manufacture the Schottky devices, which increases cost. Another drawback is that these Schottky devices have low reverse voltage blocking capabilities, high current leakage characteristics, and high forward voltage drops.

Accordingly, it would be advantageous to have Schottky devices that offer fast switching and soft recovery characteristics with a high voltage blocking capability, a low leakage current, and a low forward voltage drop. It would be of further advantage for the method of manufacturing the Schottky device to be cost efficient, time efficient, and compatible with Schottky device manufacturing processes.

BRIEF DESCRIPTION OF THE DRAWINGS

The present invention will be better understood from a reading of the following detailed description, taken in conjunction with the accompanying drawing figures, in which like reference characters designate like elements and in which.

Figure 1:
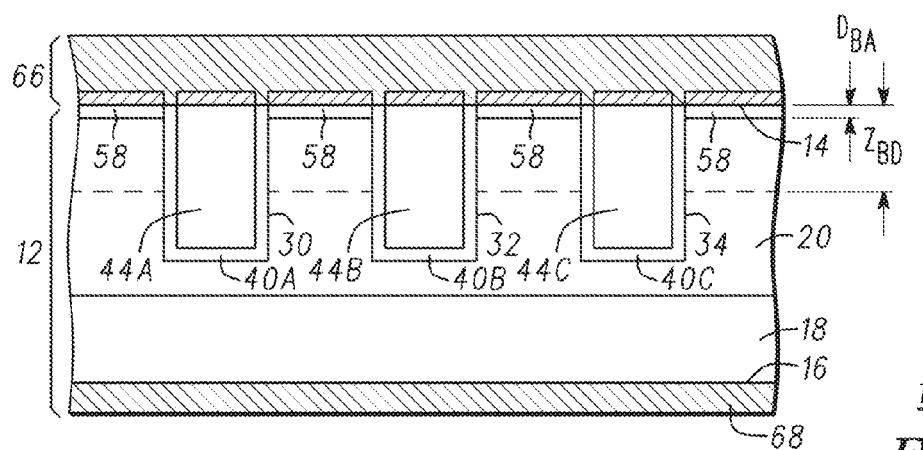
FIG. 1 is a cross-sectional view of a semiconductor component in accordance with an embodiment of the present invention.

For simplicity and clarity of illustration, elements in the figures are not necessarily to scale, and the same reference characters in different figures denote the same elements. Additionally, descriptions and details of well-known steps and elements are omitted for simplicity of the description. As used herein current carrying electrode means an element of a device that carries current through the device such as a source or a drain of an MOS transistor or an emitter or a collector of a bipolar transistor or a cathode or an anode of a diode, and a control electrode means an element of the device that controls current flow through the device such as a gate of an MOS transistor or a base of a bipolar transistor. Although the devices are explained herein as certain n-channel or p-channel devices, or certain n-type or p-type doped regions, a person of ordinary skill in the art will appreciate that complementary devices are also possible in accordance with embodiments of the present invention. It will be appreciated by those skilled in the art that the words during, while, and when as used herein are not exact terms that mean an action takes place instantly upon an initiating action but that there may be some small but reasonable delay, such as a propagation delay, between the reaction that is initiated by the initial action and the initial action. The use of the words approximately, about, or substantially means that a value of an element has a parameter that is expected to be very close to a stated value or position. However, as is well known in the art there are always minor variances that prevent the values or positions from being exactly as stated. It is well established in the art that variances of up to about ten percent (10%) (and up to twenty percent (20%) for semiconductor doping concentrations) are regarded as reasonable variances from the ideal goal of exactly as described.

DETAILED DESCRIPTION

Generally the present invention provides a Schottky device and a method for manufacturing the Schottky device that includes a barrier height adjust implant that has a doped layer thickness that is less than the zero bias depletion region of the Schottky interface $Z_{BD}$, i.e., the doped layer extends into a semiconductor material a smaller or shorter distance from surface 14 than the zero bias depletion region or boundary $Z_{BD}$ of the Schottky interface extends into semiconductor material 12 from surface 14. This approach uses an image-force barrier height modulation phenomena in combination with the applied reverse bias voltage in Schottky junctions wherein the reverse image barrier is increased with increasing reverse bias.

FIG. 1 is a cross-sectional view of a portion of a semiconductor component such as, for example, a Schottky device 10 in accordance with an embodiment of the present invention. What is shown in FIG. 1 is a semiconductor material 12 having major surfaces 14 and 16 and comprising an epitaxial layer 20 formed on a semiconductor substrate 18. Trenches 30, 32, and 34 extend from major surface 14 into at least epitaxial layer 20. Trenches 30, 32, and 34 have sidewalls that are lined with a dielectric material 40A, 40B, and 40C, respectively. Polysilicon fill material 44A, 44B, and 44C is formed on dielectric liners 40A, 40B, and 40C, respectively. A Schottky contact 66 is formed in contact with major surface 14 and a conductor 68 is formed in contact with major surface 16. It should be noted that Schottky contact 66 is formed to be in contact with doped region 58. In accordance with embodiments of the present invention, one or more doped regions 58 extend from major surface 14 into epitaxial layer 20 a distance $D_{BA}$, wherein distance $D_{BA}$ is less than a zero bias depletion region width $Z_{BD}$ and the total integrated charge, $Q_D$, of each doped region 58, which is given by the integral of the doping concentration of doped region 58 over distance $D_{BA}$, can be approximated as half the product of the peak surface concentration of a doped region 58 and distance $D_{BA}$. Thus, trenches 30, 32, and 34 extend into semiconductor material 12 a distance that is greater than the zero bias depletion width. Doped region 58 may be referred to as a barrier height adjustment region, a barrier height adjustment layer, or a doped layer, and zero bias depletion width $Z_{BD}$ may be referred to as the zero bias depletion boundary. In an embodiment, semiconductor material 12 is of N-type conductivity and doped layer 58 is of P-type conductivity and in another embodiment semiconductor material 12 is of P-type conductivity and doped layer 58 is of N-type conductivity. It should be noted that barrier height adjustment layer 58 may be formed before the formation of the Schottky contact or after the formation of the Schottky contact.

Figure 2:
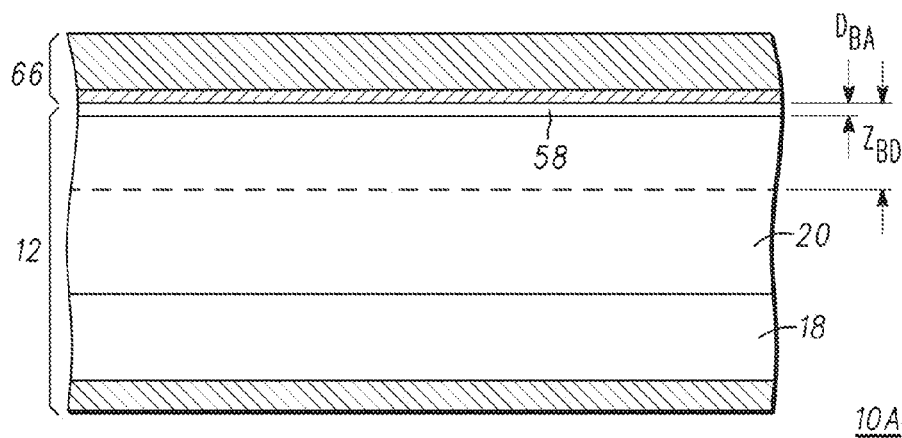
FIG. 2 is a cross-sectional view of a semiconductor component in accordance with another embodiment of the present invention.

FIG. 2 is a cross-sectional view of a semiconductor component 10A in accordance with another embodiment of the present invention. Schottky device 10A includes semiconductor material 12, Schottky contact 66, contact 68, and doped region 58. However, trenches 30, 32, and 34, dielectric liners 40A, 40B, and 40C, and polysilicon fill 44A, 44B, and 44C are absent from Schottky device 10A.

Figure 3:
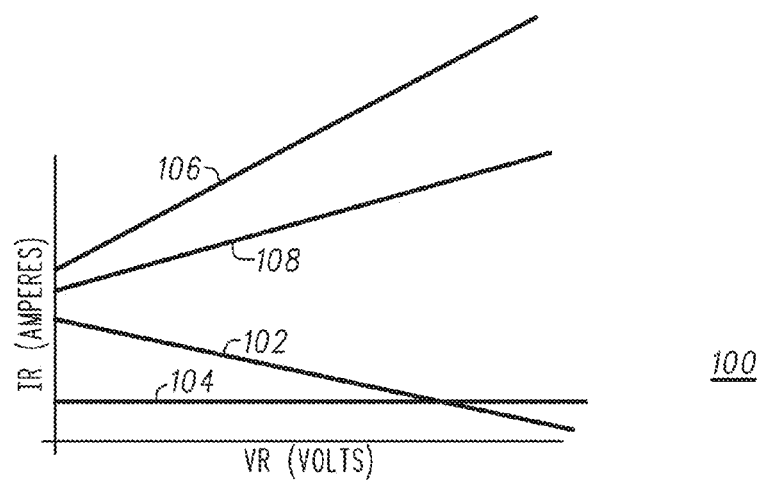
FIG. 3 is a performance graph of a semiconductor component in accordance with embodiments of the present invention.

FIG. 3 is a performance graph 100 illustrating leakage current, IR, versus a reverse voltage, VR, in accordance with an embodiment of the present invention. Performance graph 100 may be referred to as graph 100. Plot 102 illustrates that leakage current IR decreases with increasing reverse voltage VR in accordance with embodiments of the present invention in which the thickness of doped layer 58 is less than the zero bias depletion region width $Z_{BD}$, i.e., doped layer 58 extends into semiconductor material 12 a smaller or shorter distance from surface 14 than the zero bias depletion region extends into semiconductor material 12 from surface 14. The total integrated charge of doped layer 58 is identified by reference character $Q_D$, which is given by the integral of the doping concentration of doped layer 58 over depth $D_{BA}$ and is approximately half the product of distance $D_{BA}$ and the peak surface doping concentration of doped layer 58. Preferably, the total integrated charge, $Q_D$, of doped layer 58, ranges from about $10^9$ atoms per centimeter cubed (atoms/cm$^3$) to about $10^{13}$ atoms/cm$^3$. Plot 102 illustrates that the combination of the distance and peak surface concentration provides the unexpected result of the reverse current IR decreasing with increasing reverse voltage. For the sake of completeness, plots 104, 106, and 108 are included wherein plot 104 illustrates the effect on leakage current versus reverse voltage for devices in which the thickness of doped layer 58 is greater than zero bias depletion region width $Z_{BD}$, the total integrated charge $Q_D$ of doped layer 58 is greater than $10^{13}$ atoms/cm$^3$, or both, resulting in the leakage current IR remaining substantially constant with increasing reverse voltage VR and the device behaving like a PiN diode; plot 106 illustrates the effect on leakage current IR versus reverse voltage VR for devices in which doped layer 58 is of the same conductivity type as semiconductor material 12 and shallower than the zero bias depletion region width; and plot 108 illustrates the effect on leakage current IR versus reverse voltage in which doped layer 58 is absent, resulting in the leakage current increasing with increasing reverse voltage VR.

Figure 4:
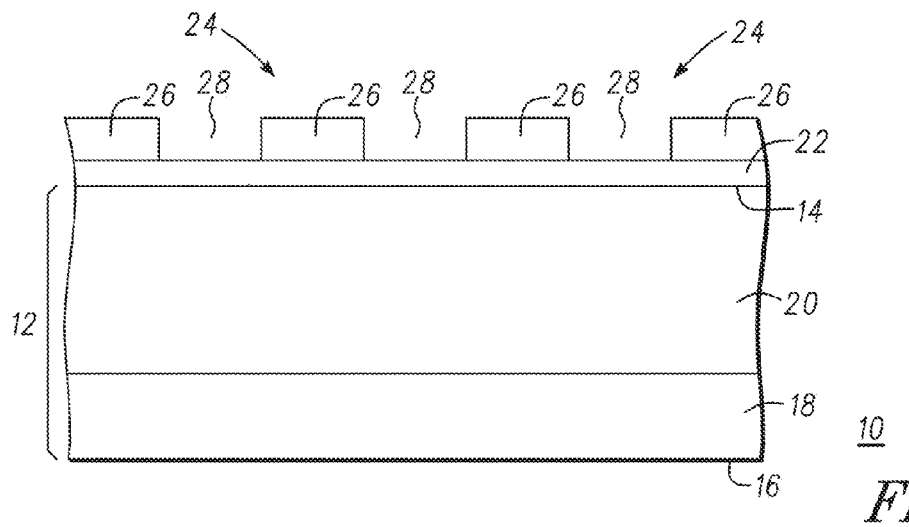
FIG. 4 is a cross-sectional view of a semiconductor component at an early stage of manufacture in accordance with an embodiment of the present invention.

FIG. 4 is a cross-sectional view of a portion of a semiconductor component 10 such as for example, a Schottky device, during manufacture in accordance with an embodiment of the present invention. What is shown in FIG. 4 is a semiconductor material 12 having opposing surfaces 14 and 16. Surface 14 is also referred to as a front or top surface and surface 16 is also referred to as a bottom or back surface. In accordance with this embodiment, semiconductor material 12 comprises an epitaxial layer 20 formed on a semiconductor substrate 18. Preferably, substrate 18 is silicon heavily doped with an N-type dopant or impurity material and epitaxial layer 20 is silicon lightly doped with an N-type dopant. In accordance with embodiments of the present invention, substrate 18 has a resistivity of less than about 6 milliOhm-centimeters (mΩ-cm) and epitaxial layer 20 has a thickness ranging about 1.5 micrometers (μm) for a 20 volt trench Schottky device to about 125 μm for a 1,000 volt trench Schottky device and a resistivity ranging from about 0.1 Ω-cm for a 20 volt trench Schottky device to about 100 Ω-cm for a 1,000 volt trench Schottky device. By way of example, substrate 18 has a resistivity of about 5 mΩ-cm, epitaxial layer 20 has a resistivity of about 3.1 Ω-cm and a thickness of about 6 μm for a rated breakdown voltage of 100 volts. Although exemplary values have been provided for a trench Schottky device, this is not a limitation of the present invention. The Schottky device also can be a planar Schottky device. Substrate layer 18 provides a low resistance conduction path for the current to flow in a Schottky device. It should be noted that a region or layer doped with an N-type dopant is said to be of an N-type conductivity or an N conductivity type and a region or layer doped with a P-type dopant is said to be of a P-type conductivity or a P conductivity type. Suitable N-type dopants include arsenic, antimony, phosphorus, or the like and suitable P-type dopants include boron, indium, or the like.

It should be appreciated that semiconductor material 12 typically includes an active region and an edge termination region (not shown).

Still referring to FIG. 4, surface 14 is cleaned using, for example, a wet hydrofluoric (HF) acid etching process, then a layer of dielectric material 22 is formed on or from epitaxial layer 20. In accordance with an embodiment, the material of dielectric layer 22 is silicon dioxide having a thickness ranging from about 100 Angstroms (Å) to about 5,000 Å. By way of example, silicon dioxide layer 22 is formed using a dry oxidation process or a steam oxidation process at a temperature ranging from about 750 degrees Celsius (° C.) to about 1,050° C. An exemplary temperature for forming dielectric layer is 900° C. Dielectric layer 22 may be formed by oxidation techniques, deposition techniques, etc. Other suitable materials for dielectric layer 22 include silicon nitride or the like.

A layer of photoresist is patterned over dielectric layer 22 to form a masking structure 24 having masking elements 26 and openings 28 that expose portions of dielectric layer 22. Masking structure 24 is also referred to as a mask or an etch mask.

Figure 5:
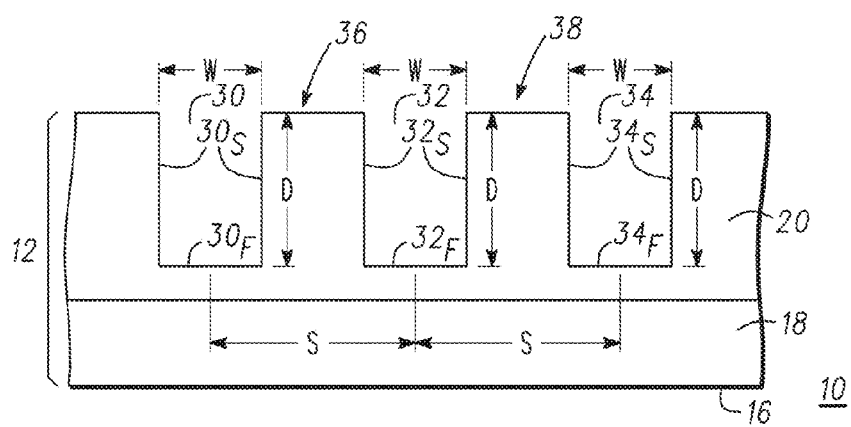
FIG. 5 is a cross-sectional view of the semiconductor component of FIG. 4 at a later stage of manufacture.

Referring now to FIG. 5, trenches 30, 32, and 34 are formed in epitaxial layer 20 by removing portions of dielectric layer 22 and portions of epitaxial layer 20 exposed by the removal of the portions of dielectric layer 22. More particularly, the exposed portions of dielectric layer 22 and the portions of epitaxial layer 20 that are below the exposed portions of dielectric layer 22 are removed. Dielectric layer 22 having the removed portions, i.e., the remaining portions of dielectric layer 22 may be referred to as a hardmask. Trench 30 has sidewalls $30_S$ and a floor $30_F$, trench 32 has sidewalls $32_S$ and a floor $32_F$, and trench 34 has sidewalls $34_S$ and a floor $34_F$. By way of example, trenches 30, 32, and 34 may be formed using Reactive Ion Etching (RIE) etching with a fluorine and oxygen based chemistry, wherein the fluorine to oxygen ratio may be used to control the trench profile parameters such as the anisotropy of the trenches and the uniformity of the trench depth. For a 20 volt to a 1,000 volt trench Schottky structure, trenches 30, 32, and 34 may be etched to have a depth, D, ranging from about 1.0 μm to about 30 μm, a trench width, W, ranging from about 0.2 μm to about 3 μm, and a center-to-center spacing, S, ranging from about 0.5 μm to about 7 μm. By way of example, trenches 30, 32, and 34 have a depth, D, of about 2.2 μm, a width, W, of about 0.8 μm, a center-to-center spacing, S, of about 3 μm for a 100 volt trench Schottky structure. Although trenches 30, 32, and 34 are shown has having the same depths, D, widths, W, and center-to-center spacings, S, this is not a limitation of the present invention. The dimensions of trenches 30, 32, 34 may be different from each other or, alternatively, one or more of the dimensions D, W, and S may be the same as each other and one or more of the other dimensions D, W, and S may be different from each other. It should be appreciated that these examples are for a 100 volt trench Schottky device, however the breakdown voltage is not limited to being for a 100 volt trench Schottky structure or for a trench Schottky structure. The voltage range may be greater than 100 volts and the Schottky device may be a planar Schottky device.

Trenches with vertical sidewalls are shown and described, however this is not a limitation of the present invention. Alternatively trenches 30, 32, and 34 may have tapered profiles where the widths of trenches 30-34 at their trench floors may be less than their widths near surface 14. In accordance with embodiments in which the trench sidewalls are substantially vertical and the trench floors are substantially parallel to surface 14, the sidewalls serve as vertical surfaces and the floors serve as horizontal surfaces. Trenches 30-34 are shown as ending in epitaxial layer 20, however, this is not a limitation of the present invention. For example, trenches 30-34 may end at substrate 18 or they may extend into substrate 18. The etching technique and the number of trenches 30-34 formed in epitaxial layer 20 are not limitations of the present invention.

The formation of trenches 30, 32, and 34 leaves portions of semiconductor material 12 that are configured as mesa structures 36 and 38. Mesa structure 36 is the portion of semiconductor material 12 between and laterally bounded by trenches 30 and 32 and mesa structure 38 is the portion of semiconductor material 12 between and laterally bounded by trenches 32 and 34. The remaining portions of dielectric layer 22 are removed.

Figure 6:
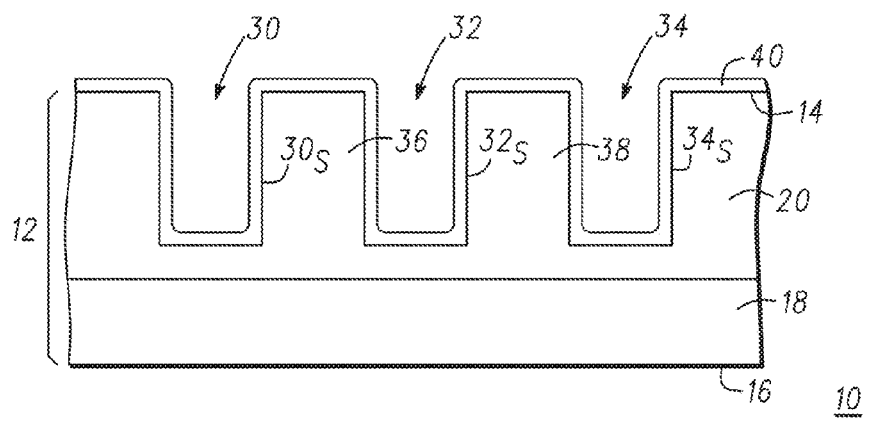
FIG. 6 is a cross-sectional view of the semiconductor component of FIG. 5 at a later stage of manufacture.

Referring now to FIG. 6, a dielectric layer 40 is formed on surface 14, sidewalls $30_S$ and floor $30_F$ of trench 30, sidewalls $32_S$ and floor $32_F$ of trench 32, and sidewalls $34_S$ and floor $34_F$ of trench 34. In accordance with an embodiment, dielectric layer 40 is silicon dioxide formed by oxidation of the exposed portions of epitaxial layer 20 and have a thickness ranging from 1,000 Å to about 5,000 Å using a wet oxidation technique at a temperature ranging from about 1,000° C. to about 1,400° C. By way of example, dielectric layer 40 has a thickness of about 3,800 Å and is formed by a wet oxidation process at a temperature of about 1,150° C.

Figure 7:
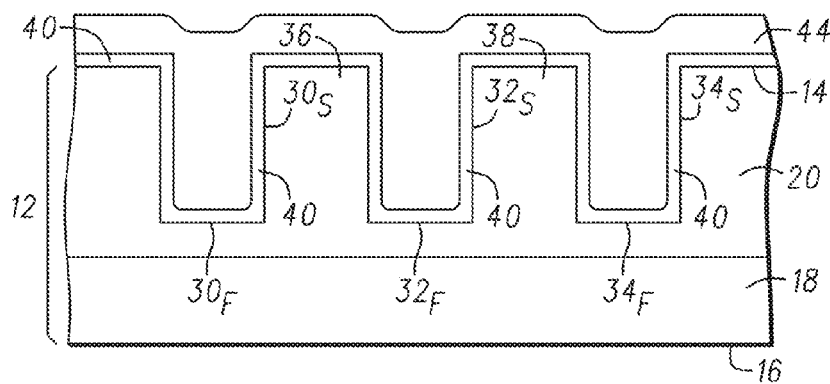
FIG. 7 is a cross-sectional view of the semiconductor component of FIG. 6 at a later stage of manufacture.

Referring now to FIG. 7, a layer of semiconductor material 44 is formed on dielectric layer 40. In accordance with an embodiment, the material of semiconductor layer 44 is polysilicon doped with an N-type impurity material having a dopant concentration ranging from about $1\times10^{18}$ atoms/cm$^3$ to about $1\times10^{20}$ atoms/cm$^3$. By way of example, semiconductor layer 44 is doped with phosphorus having a dopant concentration of about $1\times10^{19}$ atoms/cm$^3$. Trenches 30, 32, and 34 may be completely filled with polysilicon layer 44 or partially filled with polysilicon layer 44. In addition, polysilicon layer 44 may be undoped or doped. By way of example, a lightly doped polysilicon layer is less than about $1\times10^{14}$ atoms/cm$^3$, a moderately doped polysilicon layer 58 is between about $1\times10^{14}$ atoms/cm$^3$ and about $1\times10^{18}$ atoms/cm$^3$, and a heavily doped polysilicon layer is greater than about $1\times10^{18}$ atoms/cm$^3$.

Figure 8:
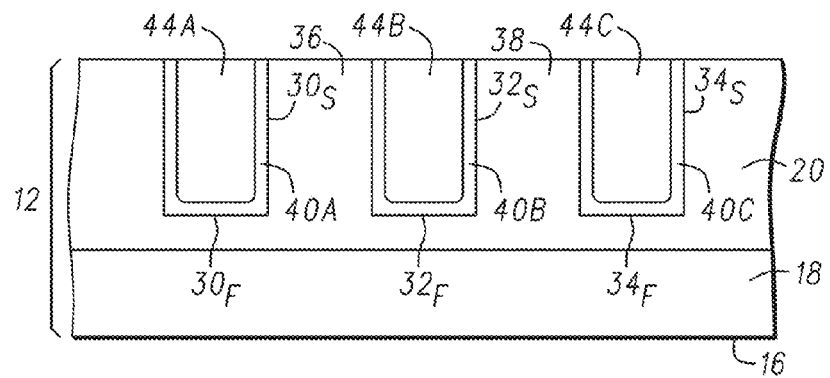
FIG. 8 is a cross-sectional view of the semiconductor component of FIG. 7 at a later stage of manufacture.

Referring now to FIG. 8, polysilicon layer 44 is etched back using, for example, a plasma ion etcher with a fluorine chemistry. Etching back polysilicon layer 44 leaves portions 44A, 44B, and 44C on dielectric layer 40 and exposes the portions of dielectric layer 40 on surface 14. The exposed portions of dielectric layer 40 on surface 14 are etched using, for example, an in-situ silicon etch back process that leaves surface 14 exposed and leaves portion 40A along sidewalls $30_S$ and floor $30_F$, portion 40B along sidewalls $32_S$ and floor $32_F$, and portion 40C along sidewalls $40_S$ and floor $40_F$ of trenches 30, 32, and 34, respectively. Portions 44A, 44B, and 44C of polysilicon layer 44 may be referred to as polysilicon fill. Thus, a plurality of trenches 30, 32, and 34 extends into semiconductor material 12, where the trenches have a floor and sidewalls, a dielectric material (40A, 40B, and 40C) on the floor and sidewalls and a semiconductor material (44A, 44B, and 44C) on the dielectric material. It should be noted that an optional planarization step may be performed to planarize the surface 14 and the exposed portions of polysilicon fill 44A, 44B, and 44C of polysilicon layer 44 and the exposed portions of portions 40A, 40B, and 40C of dielectric layer 40. By way of example, the optional planarization step may include the use of an ion plasma tool with fluorine, chlorine, and oxygen chemistries.

Figure 9:
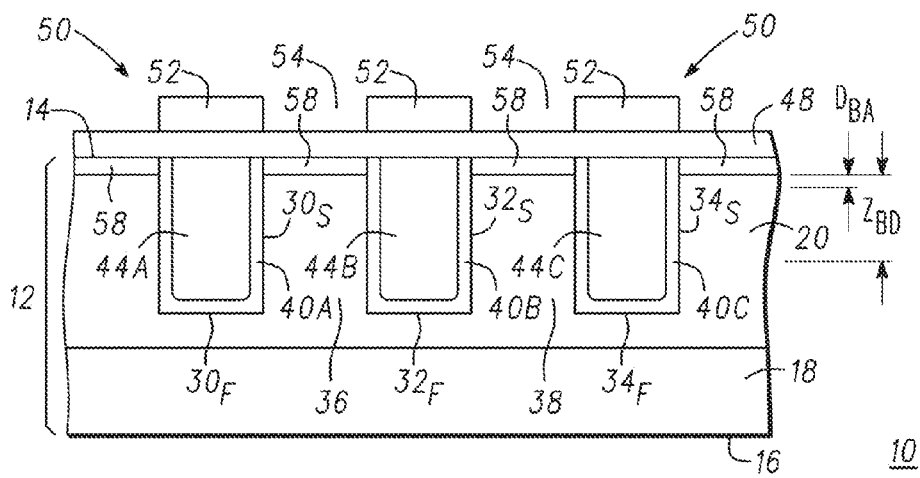
FIG. 9 is a cross-sectional view of the semiconductor component of FIG. 8 at a later stage of manufacture.

Referring now to FIG. 9, a screen oxide layer 48 is formed on or from portions of surface 14, polysilicon fill 44A, 44B, and 44C, and optionally on the exposed portions of portions 40A, 40B, and 40C of dielectric layer 40. A layer of photoresist is patterned over screen oxide layer 48 to form a masking structure 50 having masking elements 52 and openings 54 that expose portions of screen oxide layer 48 over mesa structures 36 and 38 and the portions of semiconductor material 12 adjacent to trenches 30 and 34. Masking structure 50 may be referred to as a mask, an implant mask, or a screen mask.

A barrier height adjustment implant is performed by implanting an impurity material such as, for example, boron or indium through the exposed portions of masking structure 50 and into a portion of semiconductor material 12 adjacent to surface 14 to form doped regions 58. The barrier height adjustment species, i.e., the impurity material of doped regions 58 extends a distance $D_{BA}$ into semiconductor material 12 from surface 14, wherein distance $D_{BA}$ is less than the zero bias depletion region width or boundary $Z_{BD}$. By way of example, the zero bias depletion region width $Z_{BD}$ for a 100 volt trench Schottky device is approximately 3,000 Angstroms (Å). In addition to the thickness of doped regions 58, the total integrated charge, $Q_D$, of doped regions 58, which is given by the integral of the doping concentration of doped region 58 over distance $D_{BA}$, can be approximated as half the product of the peak surface concentration of doped region 58 and distance $D_{BA}$. For some embodiments, the total integrated charge, $Q_D$, of doped layer 58 ranges from about $10^9$ atoms/cm$^3$ to about $10^{13}$ atoms/cm$^3$. It should be noted that these numbers depend on the breakdown voltage and the reverse leakage current specifications of the device. The zero bias depletion region width may be referred to as a zero bias depletion region boundary or a zero bias depletion boundary. It should be further noted that using a masking structure such as masking structure 50 is not a limitation of the present invention. For example, the masking step, i.e., masking structure 50 and its formation, may be eliminated and the barrier height adjustment implant can be into surface 14 of semiconductor material 12 and into polysilicon fill 44A, 44B, and 44C.

Figure 10:
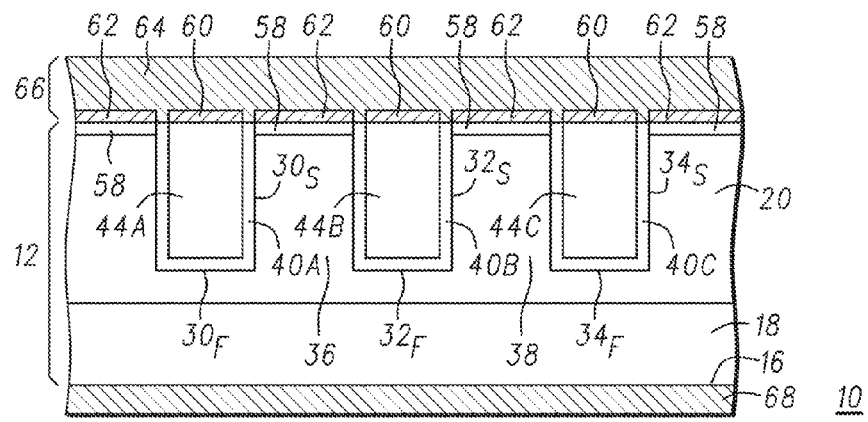
FIG. 10 is a cross-sectional view of the semiconductor component of FIG. 9 at a later stage of manufacture.

Referring now to FIG. 10, masking structure 50 is removed and the remaining portions of screen oxide layer 48 are removed. A layer of refractory metal (not shown) is deposited over mesa structures 36 and 38, the exposed portions of surface 14, polysilicon fill 44A, 44B, and 44C, and the exposed portions of portions 40A, 40B, and 40C of dielectric layer 40. In accordance with an embodiment, the refractory metal is a nickel platinum metal alloy having a thickness ranging from about 100 Å to about 2,000 Å. By way of example, the nickel platinum metal alloy has a thickness of about 700 Å. The nickel platinum metal alloy is treated by a rapid thermal anneal in a nitrogen ambient at a temperature ranging from about 300° C. to about 700° C. for a time ranging from about 15 seconds to about 120 seconds. The heat treatment causes the nickel platinum metal alloy to react with the silicon to form nickel platinum silicide in all regions in which the nickel platinum metal alloy is in contact with silicon or polysilicon. Thus, nickel platinum silicide layers 60 are formed from polysilicon fill 44A, 44B, and 44C and nickel platinum silicide layers 62 are formed from doped regions 58 and the exposed portions of epitaxial layer 20. The unreacted nickel platinum metal alloy is removed using for example a hot SPM strip. The hot SPM strip solution may be comprised of sulfuric acid and hydrogen peroxide.

Barrier metal layers (not shown) are formed in contact with nickel platinum silicide layers 60 and 62. Suitable materials for the barrier metal layers include titanium nitride, titanium, tungsten, platinum, aluminum copper, or the like. A metal layer 64 is formed in contact with the barrier metal layers. Suitable materials for metal layer 64 include aluminum, nickel, silver, or the like. Silicide layers 60 and 62, the barrier metal layers, and metal layer 64 form a Schottky contact 66, which serves as an anode of Schottky device 10. The metals of Schottky contact 66 may be referred to collectively as a Schottky metallization system. It should be noted that Schottky contact 66 is formed to be in contact with doped region 58 and that doped region 58 is formed before forming Schottky contact 66. A conductor 68 is formed in contact with surface 16 and serves as a cathode or cathode conductor for Schottky device 10 and may be referred to as a cathode metallization system. Suitable electrically conductive materials for conductor 68 include a gold alloy, titanium-nickel-gold, titanium-nickel-silver, or the like.

Figure 11:
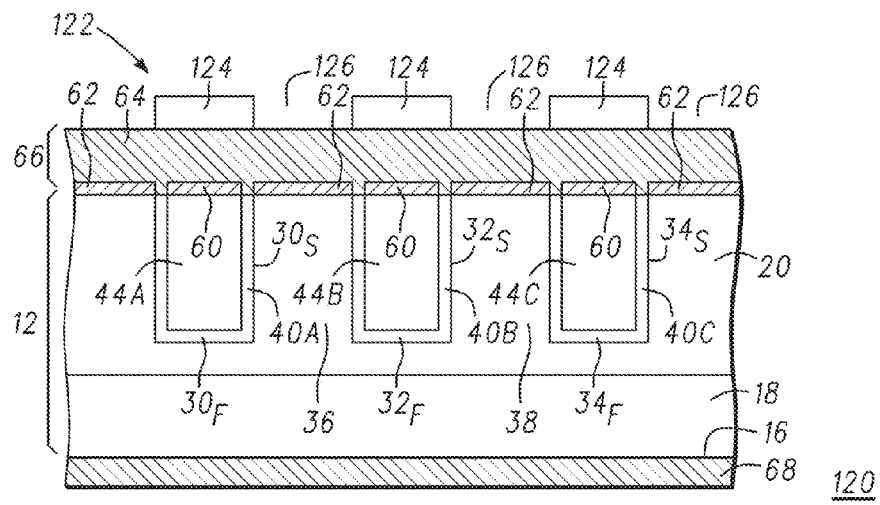
FIG. 11 is a cross-sectional view of a semiconductor component during manufacture in accordance with another embodiment of the present invention.

FIG. 11 is a cross-sectional view of a Schottky device 120 in accordance with another embodiment of the present invention. It should be noted that the processing steps for the formation of Schottky device 120 may be the same as those described with reference to FIGS. 4-8 for Schottky device 10. Accordingly, the description of Schottky device 120 continues from FIG. 8. What is shown in FIG. 11 is layer of refractory metal (not shown) is deposited over mesa structures 36 and 38, the exposed portions of surface 14, polysilicon fill 44A, 44B, and 44C, and the exposed portions of portions 40A, 40B, and 40C of dielectric layer 40. In accordance with an embodiment, the refractory metal is a nickel platinum metal alloy having a thickness ranging from about 100 Å to about 2,000 Å. By way of example, the nickel platinum metal alloy has a thickness of about 700 Å. The nickel platinum metal alloy is treated by a rapid thermal anneal in a nitrogen ambient at a temperature ranging from about 300° C. to about 700° C. for a time ranging from about 15 seconds to about 120 seconds. The heat treatment causes the nickel platinum metal alloy to react with the silicon to form nickel platinum silicide in all regions in which the nickel platinum metal alloy is in contact with silicon or polysilicon. Thus, nickel platinum silicide layers 60 are formed from polysilicon fill 44A, 44B, and 44C and nickel platinum silicide layers 62 are formed from semiconductor material 12, i.e., epitaxial layer 20, and the exposed portions of epitaxial layer 20. The unreacted nickel platinum metal alloy is removed using for example a hot SPM strip. The hot SPM strip solution may be comprised of sulfuric acid and hydrogen peroxide.

Barrier metal layers (not shown) are formed in contact with nickel platinum silicide layers 60 and 62. Suitable materials for the barrier metal layers include titanium nitride, titanium, tungsten, platinum, aluminum copper, or the like. A metal layer 64 is formed in contact with the barrier metal layers. Suitable materials for metal layer 64 include aluminum, nickel, silver, or the like. Silicide layers 60 and 62, the barrier metal layers, and metal layer 64 form a Schottky contact 66 of Schottky device 120. A conductor 68 is formed in contact with surface 16 and serves as a cathode or cathode contact for Schottky device 120. Suitable electrically conductive materials for conductor 68 include a gold alloy, titanium-nickel-gold, titanium-nickel-silver, or the like.

Still referring to FIG. 11, a layer of photoresist is patterned over Schottky contact 66 to form a masking structure 122 having masking elements 124 and openings 126 that expose portions of Schottky contact 66 over mesa structures 36 and 38 and the portions of semiconductor material 12 adjacent to trenches 30 and 34. Masking structure 122 may be referred to as a mask, an implant mask, or a screen mask.

A barrier height adjustment implant is performed by implanting an impurity material such as, for example, boron or indium through the exposed portions of masking structure 122, through Schottky contact 66, and into a portion of semiconductor material 12 adjacent to surface 14 to form doped regions 58. It should be noted that Schottky contact 66 is formed to be in contact with doped region 58. The barrier height adjustment species, i.e., the impurity material of doped regions 58 extends a distance $D_{BA}$ into semiconductor material 12 from surface 14, wherein distance $D_{BA}$ is less than the zero bias depletion region width or boundary $Z_{BD}$. By way of example, the zero bias depletion region width $Z_{BD}$ for a 100 volt trench Schottky device is approximately 3,000 Angstroms (Å). In addition to the thickness of doped regions 58, the total integrated charge, $Q_D$, of doped regions 58, which is given by the integral of the doping concentration of doped region 58 over distance $D_{BA}$, can be approximated as half the product of the peak surface concentration of doped region 58 and distance $D_{BA}$. For some embodiments, the total integrated charge, $Q_D$, of doped layer 58 ranges from about $10^9$ atoms/cm$^3$ to about $10^{13}$ atoms/cm$^3$. The zero bias depletion region width may be referred to as a zero bias depletion region boundary or a zero bias depletion boundary. Doped region 58 or barrier height adjustment layer 58 is formed after formation of Schottky contact 66. Using a masking structure such as masking structure122 is not a limitation of the present invention. For example, the masking step, i.e., masking structure 122 and its formation, may be eliminated and the barrier height adjustment implant can be into surface 14 of semiconductor material 12 and into polysilicon fill 44A, 44B, and 44C.

Figure 12:
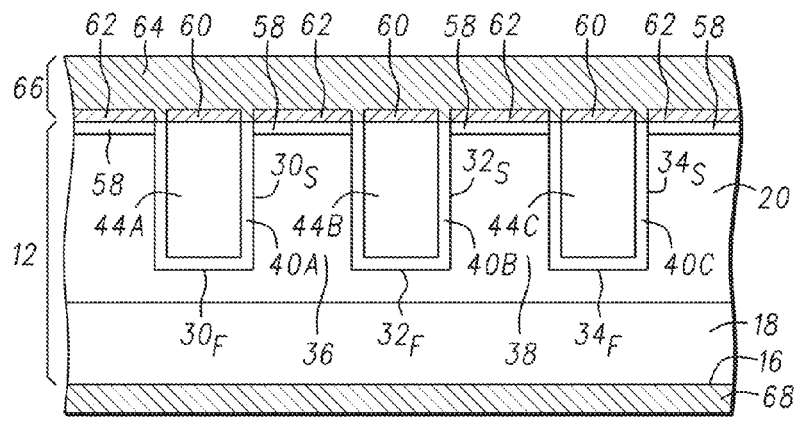
FIG. 12 is a cross-sectional view of the semiconductor component of FIG. 11 at a later stage of manufacture.

Referring now to FIG. 12, masking structure 122 is removed.

Figure 13:
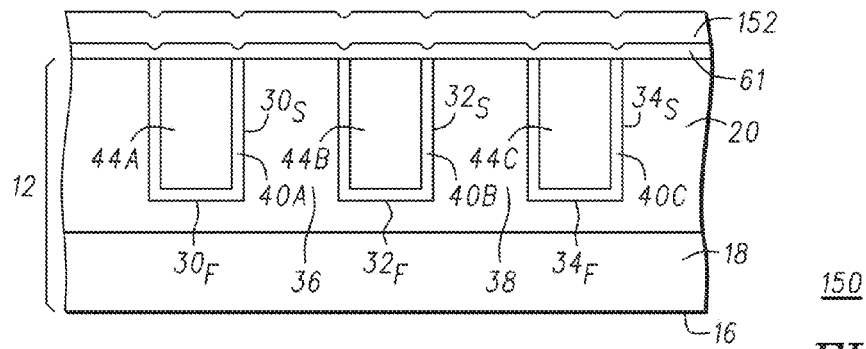
FIG. 13 is a cross-sectional view of a semiconductor component during manufacture in accordance with another embodiment of the present invention.

FIG. 13 is a cross-sectional view of a Schottky device 150 in accordance with another embodiment of the present invention. It should be noted that the processing steps for the formation of Schottky device 150 may be the same as those described with reference to FIGS. 4-8 for Schottky device 10. Accordingly, the description of Schottky device 150 continues from FIG. 8. Surface 14 is cleaned using, for example, a wet hydrofluoric (HF) acid etching process and a dielectric cap layer 61 is formed on polysilicon fill 44A, 44B, and 44C. Dielectric cap layer 61 may be referred to as oxide cap layer in embodiments in which the dielectric material of dielectric cap layer 61 is oxide. A layer of polysilicon 152 that is in-situ doped with a P-type impurity material such as, for example, boron or indium, is formed on oxide cap layer 61. By way of example, polysilicon layer 152 is doped with boron and has a boron concentration ranging from about $10^{18}$ atoms/cm$^3$ to about $10^{20}$ atoms/cm$^3$ and a thickness ranging from about 300 Å to about 3,000 Å.

Figure 14:
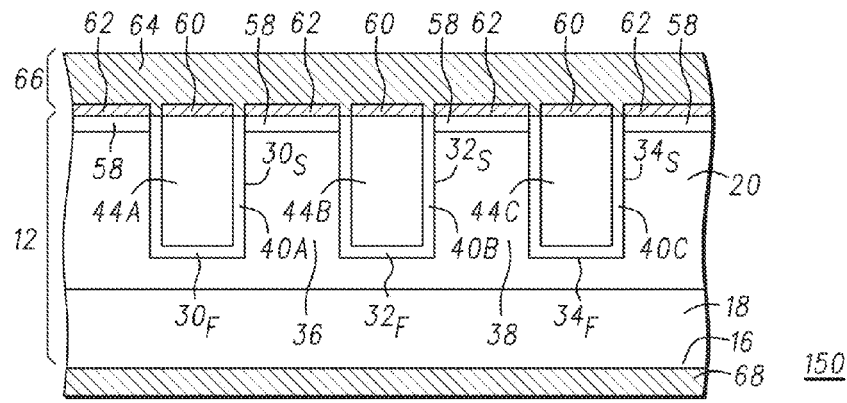
FIG. 14 is a cross-sectional view of the semiconductor component of FIG. 13 at a later stage of manufacture.

Referring now to FIG. 14, semiconductor material 12 including polysilicon layer 152 are annealed at a temperature ranging from about 800° C. to about 1,000° C. for a time ranging from 10 seconds to about 60 minutes to form doped regions 58 which extend a distance $D_{BA}$ into semiconductor material 12 from major surface 14. Thus, in-situ doped polysilicon layer 152 serves as a source of impurity materials for doped regions 58, which may be referred to as barrier height adjustment layers 58. It should be noted that distance $D_{BA}$ extends into semiconductor material 12 from surface 14 a distance that is less than the zero bias depletion region width $Z_{BD}$. Polysilicon layer 152 and oxide cap layer 61 are removed. A Schottky contact 66 is formed in contact with doped regions 58 and polysilicon fill 44A, 44B, and 44C, and a cathode 68 is formed in contact with surface 16 as described with reference to FIG. 10. Barrier height adjustment layer 58 is formed before the formation of Schottky contact 66.

Figure 15:
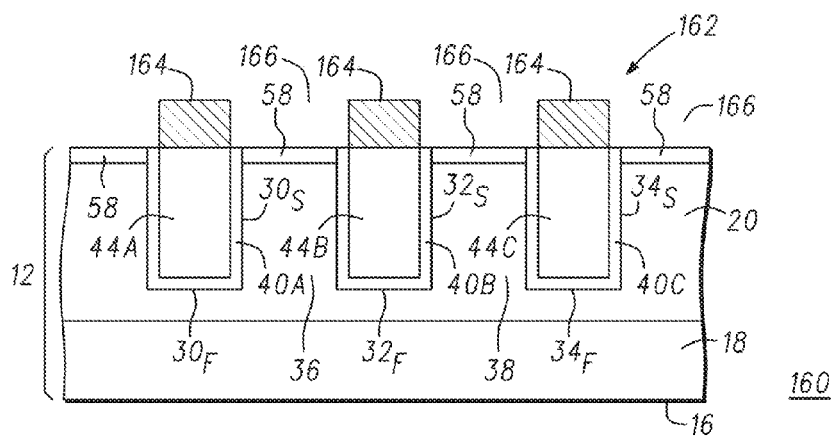
FIG. 15 is a cross-sectional view of a semiconductor component during manufacture in accordance with another embodiment of the present invention.

FIG. 15 is a cross-sectional view of a Schottky device 160 in accordance with another embodiment of the present invention. It should be noted that the processing steps for the formation of Schottky device 160 may be the same as those described with reference to FIGS. 4-8 for Schottky device 10. Accordingly, the description of Schottky device 160 continues from FIG. 8. Surface 14 is cleaned using, for example, a wet hydrofluoric (HF) acid etching process, then a layer of photoresist is patterned over surface 14, polysilicon fill 44A, 44B, and 44C, and on the exposed portions of portions 40A, 40B, and 40C of dielectric layer 40 to form a masking structure 162 having masking elements 164 and openings 166 that expose mesa structures 36 and 38 and the portions of semiconductor material 12 adjacent to and outside of trenches 30 and 34. Masking structure 162 may be referred to as a mask, an implant mask, or a screen mask.

Still referring to FIG. 15, semiconductor material 12 undergoes a plasma doping process using, for example, a boron trifluoride glow discharge to form doped regions 58, which serve as barrier height adjustment structures or layers. It should be noted that using a masking structure such as masking structure 162 is not a limitation of the present invention. For example, the masking step, i.e., masking structure 162 and its formation, may be eliminated and the barrier adjust doping can be into surface 14 of semiconductor material 12 and into polysilicon fill 44A, 44B, and 44C.

Figure 16:
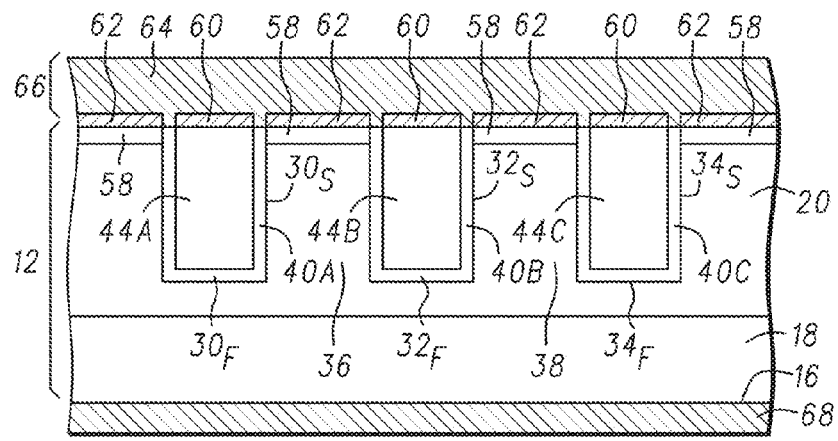
FIG. 16 is a cross-sectional view of the semiconductor component of FIG. 15 at a later stage of manufacture.

Referring now to FIG. 16, masking structure 162 is removed and a Schottky contact 66 is formed in contact with doped regions 58 and polysilicon fill 44A, 44B, and 44C and a cathode 68 is formed in contact with surface 16 as described with reference to FIG. 10.

Figure 17:
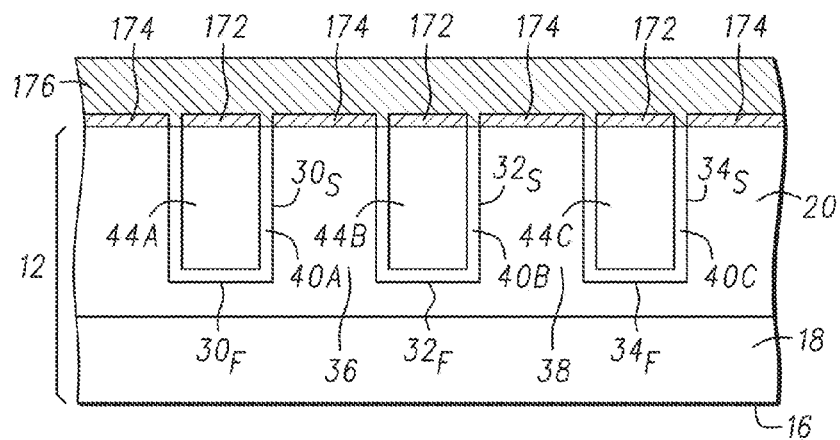
FIG. 17 is a cross-sectional view of a semiconductor component during manufacture in accordance with another embodiment of the present invention.

FIG. 17 is a cross-sectional view of a Schottky device 170 in accordance with another embodiment of the present invention. It should be noted that the processing steps for the formation of Schottky device 170 may be the same as those described with reference to FIGS. 4-8 for Schottky device 10. Accordingly, the description of Schottky device 170 continues from FIG. 8. A layer of refractory metal (not shown) is deposited over mesa structures 36 and 38, the exposed portions of surface 14, polysilicon fill 44A, 44B, and 44C, and the exposed portions of portions 40A, 40B, and 40C of dielectric layer 40. In accordance with an embodiment, the refractory metal is titanium having a thickness ranging from about 100 Å to about 2,000 Å. By way of example, the titanium has a thickness of about 700 Å. The titanium is treated to a rapid thermal anneal in a nitrogen ambient at a temperature ranging from about 300° C. to about 700° C. for a time ranging from about 15 seconds to about 120 seconds. The heat treatment causes the titanium to react with the silicon to form titanium silicide in all regions in which the titanium is in contact with silicon or polysilicon. Thus, titanium silicide layers 172 are formed from polysilicon fill 44A, 44B, and 44C and titanium silicide layers 174 are formed from mesa structures 36 and 38 and the exposed portions of epitaxial layer 20. The unreacted titanium is removed using for example a hot SPM strip. The hot SPM strip solution may be comprised of sulfuric acid and hydrogen peroxide.

A layer of aluminum 176 having a thickness ranging from about 100 Å to about 1,000 Å is formed on titanium silicide layers 172 and 174 and on the exposed portions of portions 42A, 42B, and 42C of dielectric layer 40.

Figure 18:
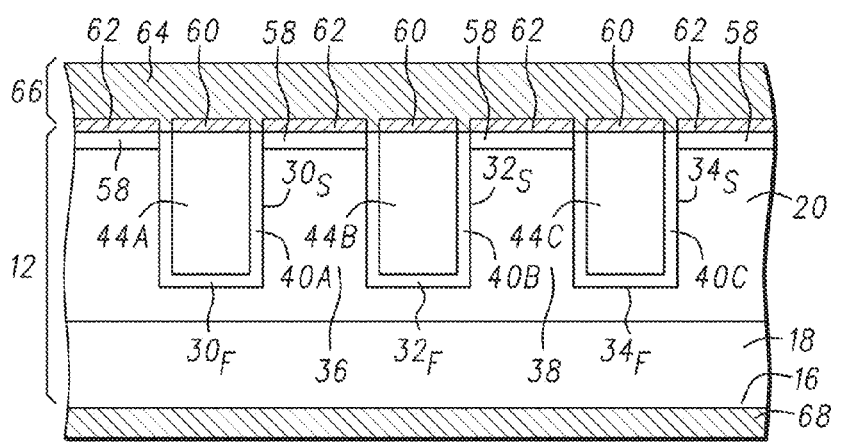
FIG. 18 is a cross-sectional view of the semiconductor component of FIG. 17 at a later stage of manufacture.

Referring now to FIG. 18, aluminum layer 176 serves as a dopant source or source of P-type impurity materials that form doped regions 58 which extend a distance $D_{BA}$ into semiconductor material 12 from major surface 14. It should be noted that distance $D_{BA}$ extends into semiconductor material 12 from surface 14 a distance that is less than the zero bias depletion region width $Z_{BD}$. Aluminum layer 176 is removed and a Schottky contact 66 is formed in contact with doped regions 58 and polysilicon fill 44A, 44B, and 44C, and a cathode 68 is formed in contact with surface 16 as described with reference to FIG. 10.

Figure 19:
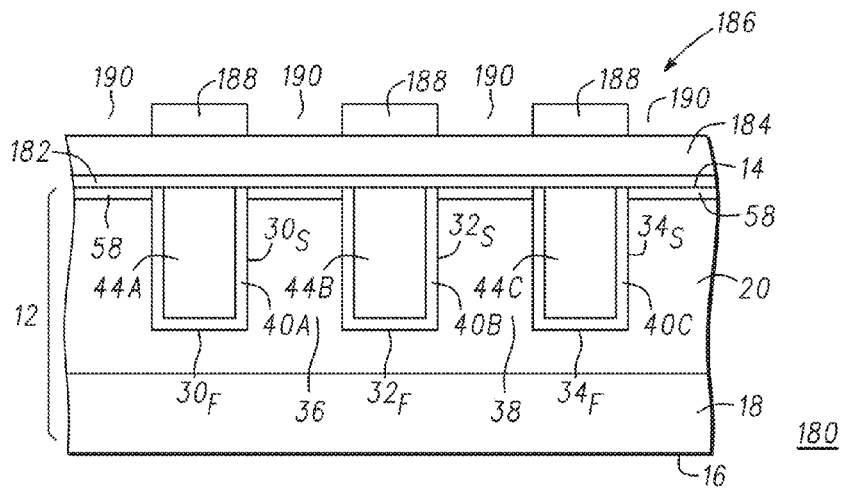
FIG. 19 is a cross-sectional view of a semiconductor component during manufacture in accordance with another embodiment of the present invention.

FIG. 19 is a cross-sectional view of a Schottky device 180 in accordance with another embodiment of the present invention. It should be noted that the processing steps for the formation of Schottky device 180 may be the same as those described with reference to FIGS. 4-8 for Schottky device 10. Accordingly, the description of Schottky device 180 continues from FIG. 8. Surface 14, polysilicon fill 44A, 44B, and 44C, and the exposed portions of portions 40A, 40B, and 40C of dielectric layer 40 is cleaned using, for example, a wet hydrofluoric (HF) acid etching process. A layer of dielectric material 182 is formed on portions of surface 14, polysilicon fill 44A, 44B, and 44C, and on the exposed portions of portions 40A, 40B, and 40C of dielectric layer 40. By way of example, dielectric layer 182 is silicon dioxide having a thickness ranging from about 10 Å to about 30 Å. Dielectric layer 182 can be formed by oxidation or deposition techniques. A layer of polysilicon 184 having a thickness ranging from about 500 Å to about 3,000 Å is formed on dielectric layer 182. A layer of photoresist is patterned over polysilicon layer 184 to form a masking structure 186 having masking elements 188 and openings 190 that expose portions of polysilicon layer 184 over mesa structures 36 and 38 and the portions of semiconductor material 12 adjacent to and outside of trenches 30 and 34. Masking structure 186 may be referred to as a mask, an implant mask, or a screen mask.

An impurity material of P-type conductivity is implanted into polysilicon layer 184. By way of example, the impurity material is boron or boron difluoride. Doped regions 58, which serve as barrier height adjustment regions, are formed in epitaxial layer 20 and in mesa structures 36 and 38 by oxide mediated diffusion of impurity materials from polysilicon layer 184. Thus, the impurity material implanted into polysilicon layer 184 serves as a source of impurity materials in forming doped regions 58 or barrier height adjustment layers 58. The barrier height adjustment species, i.e., the impurity material of doped regions 58 extends a distance $D_{BA}$ into semiconductor material 12 from surface 14, wherein distance $D_{BA}$ is less than the zero bias depletion region width or boundary $Z_{BD}$. By way of example, the zero bias depletion region width $Z_{BD}$ for a 100 volt trench Schottky device is approximately 3,000 Angstroms (Å). In addition to the thickness of doped regions 58, the total integrated charge, $Q_D$, of doped regions 58, which is given by the integral of the doping concentration of doped region 58 over distance $D_{BA}$, can be approximated as half the product of the peak surface concentration of doped region 58 and distance $D_{BA}$. For some embodiments, the total integrated charge, $Q_D$, of doped layer 58 ranges from about $10^9$ atoms/cm$^3$ to about $10^{13}$ atoms/cm$^3$. The zero bias depletion region width may be referred to as a zero bias depletion region boundary or a zero bias depletion boundary. It should be noted that using a masking structure such as masking structure 186 is not a limitation of the present invention. For example, the masking step, i.e., masking structure 186 and its formation, may be eliminated and the barrier height adjustment implant can be into surface 14 of semiconductor material 12 and into polysilicon fill 44A, 44B, and 44C.

Figure 20:
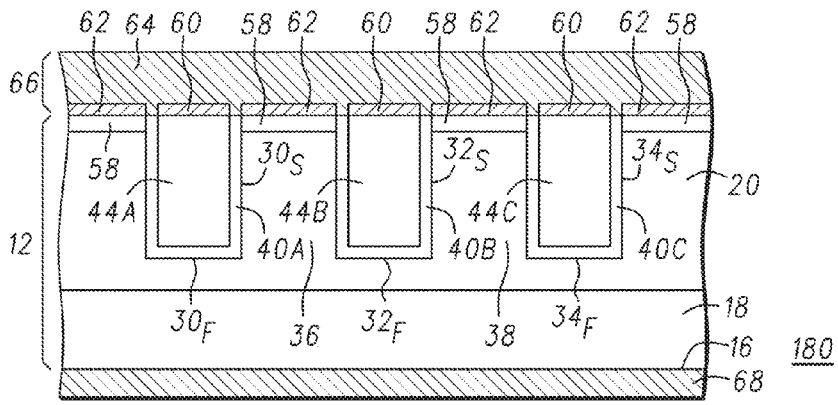
FIG. 20 is a cross-sectional view of the semiconductor component of FIG. 19 at a later stage of manufacture.

Referring now to FIG. 20, masking structure 186, polysilicon layer 184, and dielectric layer 182 are removed and a Schottky contact 66 is formed in contact with doped regions 58 and polysilicon fill 44A, 44B, and 44C and a cathode 68 is formed in contact with surface 16 as described with reference to FIG. 10.

Figure 21:
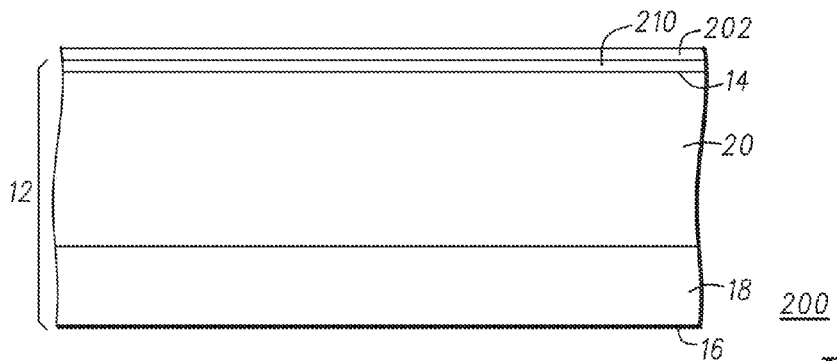
FIG. 21 is a cross-sectional view of a semiconductor component during manufacture in accordance with another embodiment of the present invention.

FIG. 21 is a cross-sectional view of a portion of a semiconductor component 200 such as for example, a Schottky device, during manufacture in accordance with another embodiment of the present invention. What is shown in FIG. 21 is a semiconductor material 12 having opposing surfaces 14 and 16. Surface 14 is also referred to as a front or top surface and surface 16 is also referred to as a bottom or back surface. In accordance with this embodiment, semiconductor material 12 comprises an epitaxial layer 20 formed on a semiconductor substrate 18. Preferably, substrate 18 is silicon heavily doped with an N-type dopant or impurity material and epitaxial layer 20 is silicon lightly doped with an N-type dopant. In accordance with embodiments of the present invention, substrate 18 has a resistivity of less than about 6 me-cm and epitaxial layer 20 has a thickness ranging about 1.5 μm for a 20 volt planar Schottky device to about 125 μm for a 1,000 volt planar Schottky device and a resistivity ranging from about 0.1 Ω-cm for a 20 volt planar Schottky device to about 100 Ω-cm for a 1,000 volt planar Schottky device. By way of example, substrate 18 has a resistivity of about 5 Ω-cm, epitaxial layer 20 has a resistivity of about 0.5 Ω-cm and a thickness of about 2 μm. Substrate layer 18 provides a low resistance conduction path for the current to flow in a Schottky device.

It should be appreciated that semiconductor material 12 typically includes an active region and an edge termination region (not shown).

Still referring to FIG. 21, surface 14 is cleaned using, for example, a wet hydrofluoric (HF) acid etching process followed by forming a screen oxide layer 202 on or from surface 14. A barrier height adjustment implant is performed by implanting an impurity material such as, for example, boron or indium through the exposed portions of screen oxide layer 202 to form a doped region or doped layer 210. The barrier height adjustment species, i.e., the impurity material of doped region 210 extends a distance $D_{BA}$ into semiconductor material 12 from surface 14, wherein distance $D_{BA}$ is less than the zero bias depletion region width $Z_{BD}$. By way of example, the zero bias depletion region width $Z_{BD}$ for a 100 volt planar Schottky device is approximately 4,000 Å. In addition to the thickness of doped region 210, the total integrated charge, $Q_D$, of doped region 210, which is given by the integral of the doping concentration of doped region 210 over distance $D_{BA}$, can be approximated as half the product of the peak surface concentration of doped region 210 and distance $D_{BA}$. For some embodiments, the total integrated charge, $Q_D$, of doped region 210 ranges from about $10^9$ atoms/cm$^3$ to about $10^{13}$ atoms/cm$^3$. The zero bias depletion region width may be referred to as a zero bias depletion region boundary or a zero bias depletion boundary.

Figure 22:
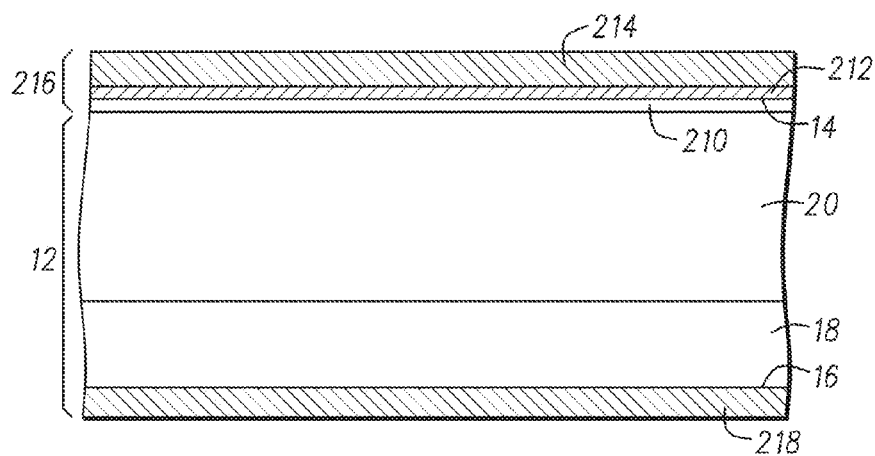
FIG. 22 is a cross-sectional view of the semiconductor component of FIG. 21 at a later stage of manufacture.

Referring now to FIG. 22, screen oxide layer 202 is removed and a layer of refractory metal (not shown) is deposited surface 14. In accordance with an embodiment, the refractory metal is a nickel platinum metal alloy having a thickness ranging from about 100 Å to about 2,000 Å. By way of example, the nickel platinum metal alloy has a thickness of about 700 Å. The nickel platinum metal alloy is treated to a rapid thermal anneal in a nitrogen ambient at a temperature ranging from about 300° C. to about 700° C. for a time ranging from about 15 seconds to about 120 seconds. The heat treatment causes the nickel platinum metal alloy to react with the silicon to form nickel platinum silicide in all regions in which the nickel platinum metal alloy is in contact with silicon or polysilicon. Thus, a nickel platinum silicide layer 212 is formed from epitaxial layer 20. The unreacted nickel platinum metal alloy is removed using for example a hot SPM strip. The hot SPM strip solution may be comprised of sulfuric acid and hydrogen peroxide.

Barrier metal layers (not shown) are formed in contact with nickel platinum silicide layer 212. Suitable materials for the barrier metal layers include titanium nitride, titanium, tungsten, platinum, aluminum copper, or the like. A metal layer 214 is formed in contact with the barrier metal layers. Suitable materials for metal layer 214 include aluminum, nickel, silver, or the like. Silicide layer 212, the barrier metal layers, and metal layer 214 form a Schottky contact 216, which serves as an anode of Schottky device 200. The metals of Schottky contact 216 may be referred to collectively as a Schottky metallization system. It should be noted that Schottky contact 216 is formed to be in contact with doped region or doped layer re210. A conductor 218 is formed in contact with surface 16 and serves as a cathode or cathode conductor for Schottky device 200 and may be referred to as a cathode metallization system. Suitable electrically conductive materials for conductor 218 include a gold alloy, titanium-nickel-gold, titanium-nickel-silver, or the like.

Figure 23:
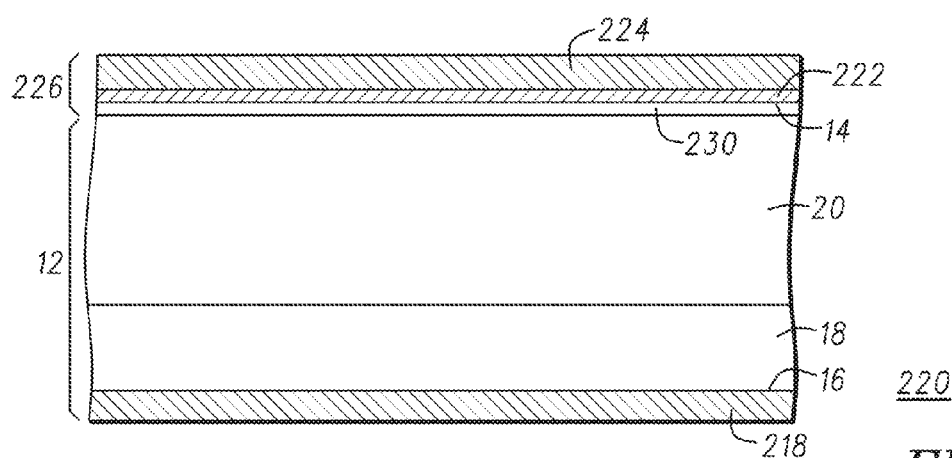
FIG. 23 is a cross-sectional view of a semiconductor component during manufacture in accordance with another embodiment of the present invention.

FIG. 23 is a cross-sectional view of a Schottky device 220 in accordance with another embodiment of the present invention. Schottky device 220 includes semiconductor material 12 having major surfaces 14 and 16 described with reference to FIG. 21. A layer of refractory metal (not shown) is deposited on surface 14. In accordance with an embodiment, the refractory metal is a nickel platinum metal alloy having a thickness ranging from about 100 Å to about 2,000 Å. By way of example, the nickel platinum metal alloy has a thickness of about 700 Å. The nickel platinum metal alloy is treated to a rapid thermal anneal in a nitrogen ambient at a temperature ranging from about 300° C. to about 700° C. for a time ranging from about 15 seconds to about 120 seconds. The heat treatment causes the nickel platinum metal alloy to react with the silicon to form nickel platinum silicide in all regions in which the nickel platinum metal alloy is in contact with silicon. Thus, a nickel platinum silicide layer 222 is formed from epitaxial layer 20. Any unreacted nickel platinum metal alloy may be removed using for example a hot SPM strip. The hot SPM strip solution may be comprised of sulfuric acid and hydrogen peroxide.

Barrier metal layers (not shown) are formed in contact with nickel platinum silicide layer 222. Suitable materials for the barrier metal layers include titanium nitride, titanium, tungsten, platinum, aluminum copper, or the like. A metal layer 224 is formed in contact with the barrier metal layers. Suitable materials for metal layer 224 include aluminum, nickel, silver, or the like. Silicide layer 222, the barrier metal layers, and metal layer 224 form a Schottky contact 226 of Schottky device 220. A conductor 218 is formed in contact with surface 16 and serves as a cathode or cathode contact for Schottky device 220. Suitable electrically conductive materials for conductor 218 include a gold alloy, titanium-nickel-gold, titanium-nickel-silver, or the like.

Still referring to FIG. 23, a barrier height adjustment implant is performed by implanting an impurity material such as, for example, boron or indium through Schottky contact 226 and into a portion of semiconductor material 12 adjacent to surface 14 to form a doped region 230. It should be noted that Schottky contact 226 is formed to be in contact with doped region 230. The barrier height adjustment species, i.e., the impurity material of doped region 230 extends a distance $D_{BA}$ into semiconductor material 12 from surface 14, wherein distance $D_{BA}$ is less than the zero bias depletion region width $Z_{BD}$. By way of example, the zero bias depletion region width $Z_{BD}$ for a 100 volt planar Schottky device is approximately 4,000 Å. In addition to the thickness of doped region 230, the total integrated charge, $Q_D$, of doped region 230, which is given by the integral of the doping concentration of doped region 230 over distance $D_{BA}$, can be approximated as half the product of the peak surface concentration of doped region 230 and distance $D_{BA}$. For some embodiments, the total integrated charge, $Q_D$, of doped region 230 ranges from about $10^9$ atoms/cm$^3$ to about $10^{13}$ atoms/cm$^3$. The zero bias depletion region width may be referred to as a zero bias depletion region boundary or a zero bias depletion boundary.

Figure 24:
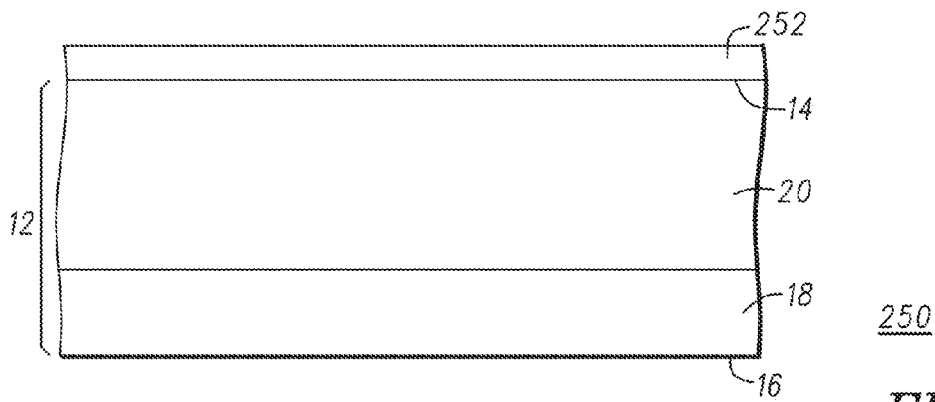
FIG. 24 is a cross-sectional view of a semiconductor component during manufacture in accordance with another embodiment of the present invention.

FIG. 24 is a cross-sectional view of a Schottky device 250 in accordance with another embodiment of the present invention. Schottky device 250 includes semiconductor material 12 having major surfaces 14 and 16 described with reference to FIG. 21. Surface 14 is cleaned using, for example, a wet hydrofluoric (HF) acid etching process, then a layer of polysilicon 252 that is in-situ doped with a P-type impurity material such as, for example, boron or indium, is formed on surface 14. By way of example, polysilicon layer 252 is doped with boron and has a boron concentration ranging from about $10^{18}$ atoms/cm³ to about $10^{20}$ atoms/cm³ and a thickness ranging from about 300 Å to about 3,000 Å.

Figure 25:
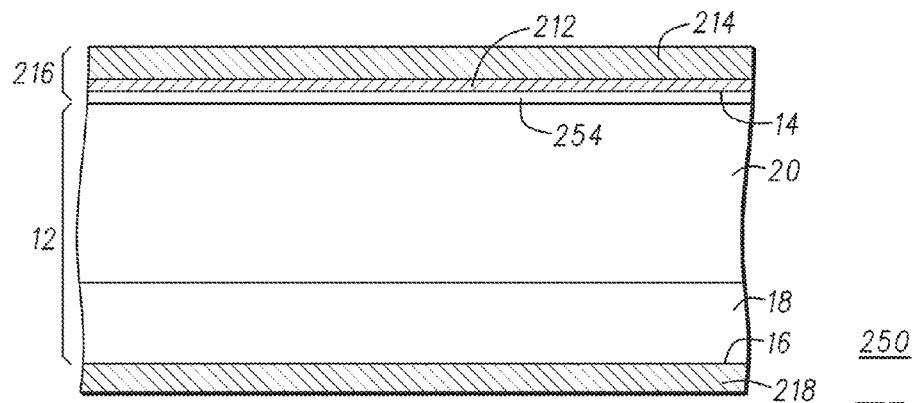
FIG. 25 is a cross-sectional view of the semiconductor component of FIG. 24 at a later stage of manufacture.

Referring now to FIG. 25, semiconductor material 12 including polysilicon layer 252 are annealed at a temperature ranging from about 800° C. to about 1,000° C. for a time ranging from about 10 seconds to about 60 minutes to a form doped region 254 which extends a distance $D_{BA}$ into semiconductor material 12 from surface 14, wherein distance $D_{BA}$ is less than the zero bias depletion region width $Z_{BD}$. Thus, in-situ doped polysilicon layer 252 serves as a source of impurity materials for doped region 254, which may be referred to as a barrier adjustment layer 254. By way of example, the zero bias depletion region width $Z_{BD}$ for a 100 volt planar Schottky device is approximately 4,000 Angstroms (Å). In addition to the thickness of doped region 254, the total integrated charge, $Q_D$, of doped region 254, which is given by the integral of the doping concentration of doped region 254 over distance $D_{BA}$, can be approximated as half the product of the peak surface concentration of doped region 254 and distance $D_{BA}$. For some embodiments, the total integrated charge, $Q_D$, of doped region 254 ranges from about $10^9$ atoms/cm³ to about $10^{13}$ atoms/cm³. The zero bias depletion region width may be referred to as a zero bias depletion region boundary or a zero bias depletion boundary. A Schottky contact 216 is formed in contact with doped region 254 and a cathode 218 is formed in contact with surface 16 as described with reference to FIG. 23.

Figure 26:
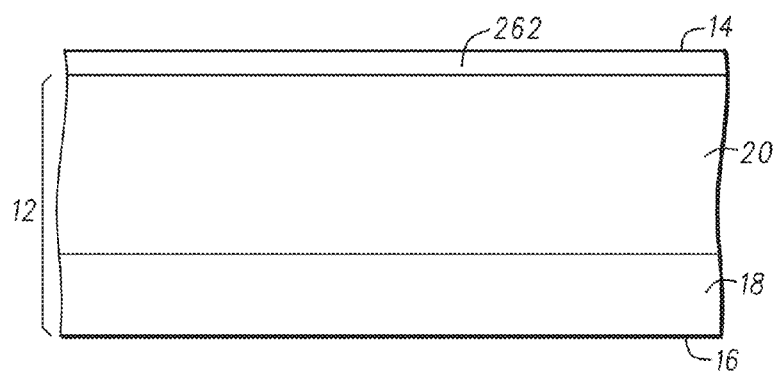
FIG. 26 is a cross-sectional view of a semiconductor component during manufacture in accordance with another embodiment of the present invention.

FIG. 26 is a cross-sectional view of a Schottky device 260 in accordance with another embodiment of the present invention. Schottky device 260 includes semiconductor material 12 having major surfaces 14 and 16 described with reference to FIG. 21. Surface 14 is cleaned using, for example, a wet hydrofluoric (HF) acid etching process, then semiconductor material 12 undergoes a plasma doping process using, for example, a boron trifluoride glow discharge to form a doped region 262, which serves as a barrier height adjustment structure or layer.

Figure 27:
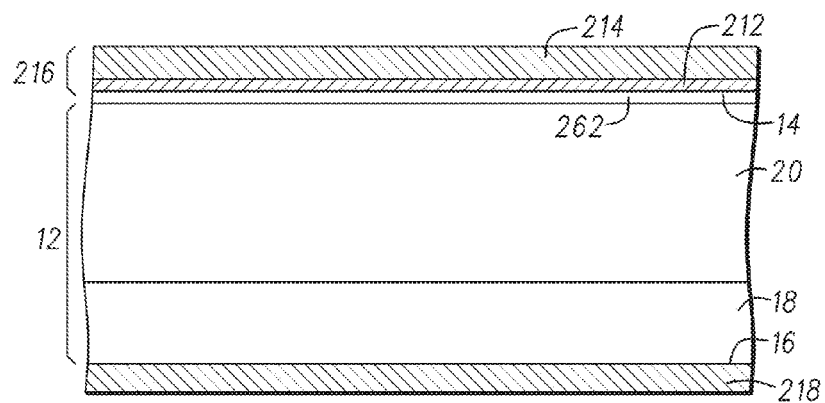
FIG. 27 is a cross-sectional view of the semiconductor component of FIG. 26 at a later stage of manufacture.

Referring now to FIG. 27, a Schottky contact 216 is formed in contact with doped region 262 and a cathode 218 is formed in contact with surface 16 as described with reference to FIG. 23.

Figure 28:
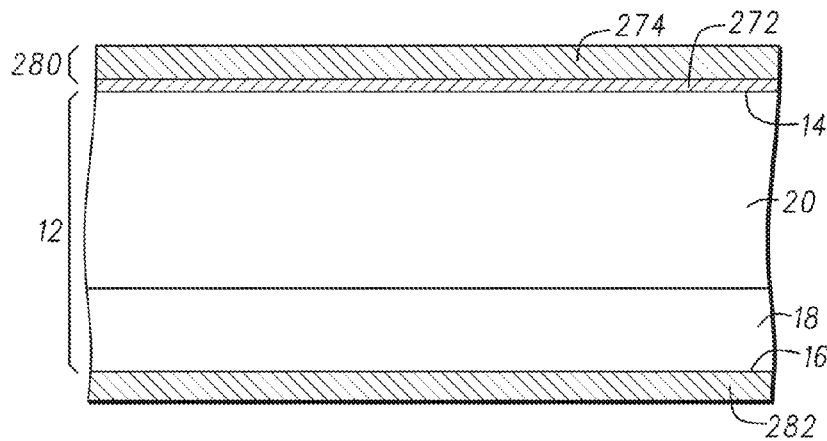
FIG. 28 is a cross-sectional view of a semiconductor component during manufacture in accordance with another embodiment of the present invention.

FIG. 28 is a cross-sectional view of a Schottky device 270 in accordance with another embodiment of the present invention. Schottky device 270 includes semiconductor material 12 having major surfaces 14 and 16 described with reference to FIG. 21. Surface 14 is cleaned using, for example, a wet hydrofluoric (HF) acid etching process and a layer of refractory metal (not shown) is deposited over surface 14. In accordance with an embodiment, the refractory metal is titanium having a thickness ranging from about 100 Å to about 2,000 Å. By way of example, the titanium has a thickness of about 700 Å. The titanium is treated to a rapid thermal anneal in a nitrogen ambient at a temperature ranging from about 300° C. to about 700° C. for a time ranging from about 15 seconds to about 120 seconds. The heat treatment causes the titanium to react with the silicon to form titanium silicide in all regions in which the titanium is in contact with silicon or polysilicon. Thus, titanium silicide layer 272 is formed from epitaxial layer 20. The unreacted titanium is removed using for example a hot SPM strip. The hot SPM strip solution may be comprised of sulfuric acid and hydrogen peroxide.

A layer of aluminum 274 having a thickness ranging from about 100 Å to about 1,000 Å is formed on titanium silicide layer 272. Aluminum layer 274 and titanium silicide layer 272 form a Schottky contact 280 that is in contact with epitaxial layer 20, i.e., in contact with semiconductor material 12, and a conductor 282 is formed in contact with surface 16 and serves as a cathode or cathode contact for Schottky device 270. Suitable electrically conductive materials for conductor 282 include a gold alloy, titanium-nickel-gold, titanium-nickel-silver, or the like.

Figure 29:
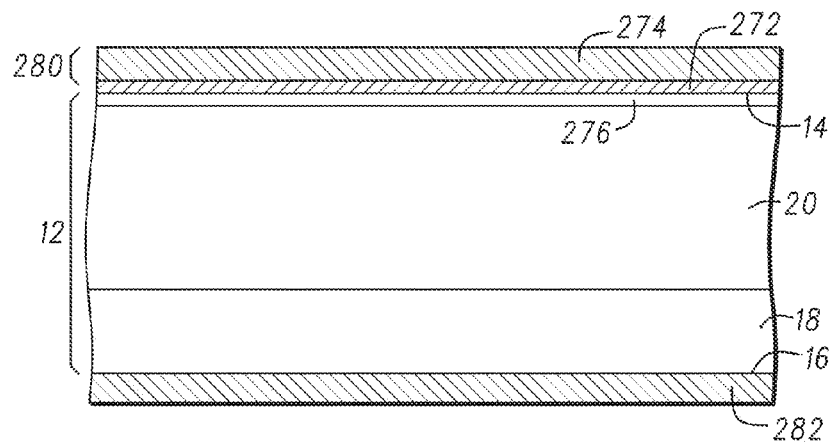
FIG. 29 is a cross-sectional view of the semiconductor component of FIG. 28 at a later stage of manufacture.

Referring now to FIG. 29, P-type dopants from aluminum layer 274 diffuse through titanium silicide layer 272 and into a portion of semiconductor material 12 adjacent to surface 14 to form a doped region or doped layer 276. It should be noted that Schottky contact 280 is in contact with doped region 276. The barrier height adjustment species, i.e., the impurity material of doped region 276 extends a distance $D_{BA}$ into semiconductor material 12 from surface 14, wherein distance $D_{BA}$ is less than the zero bias depletion region width $Z_{BD}$. By way of example, the zero bias depletion region width $Z_{BD}$ for a 100 volt planar Schottky device is approximately 4,000 Å. In addition to the thickness of doped region 276, the total integrated charge, $Q_D$, of doped region 276, which is given by the integral of the doping concentration of doped region 276 over distance $D_{BA}$, can be approximated as half the product of the peak surface concentration of doped region 276 and distance $D_{BA}$. For some embodiments, the total integrated charge, $Q_D$, of doped region 276 ranges from about $10^9$ atoms/cm³ to about $10^{13}$ atoms/cm³. The zero bias depletion region width may be referred to as a zero bias depletion region boundary or a zero bias depletion boundary. It should be noted that optionally aluminum layer 274 may be removed and replaced by a different metallization system for forming a Schottky contact.

Figure 30:
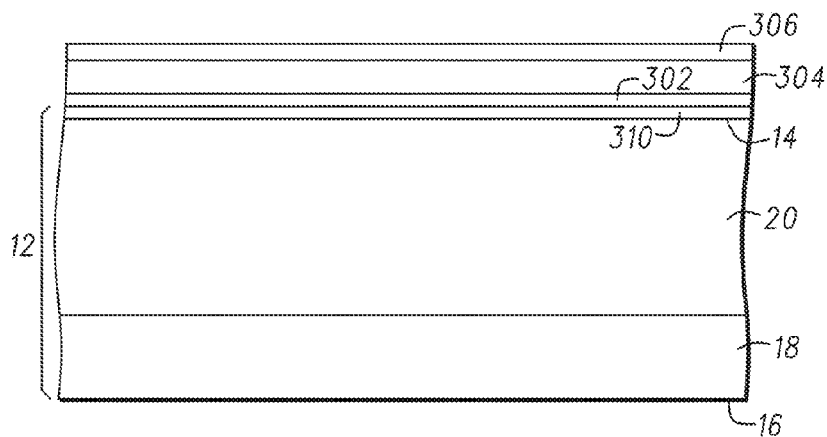
FIG. 30 is a cross-sectional view of a semiconductor component during manufacture in accordance with another embodiment of the present invention.

FIG. 30 is a cross-sectional view of a Schottky device 300 in accordance with another embodiment of the present invention. Schottky device 300 includes semiconductor material 12 having major surfaces 14 and 16 described with reference to FIG. 21. Surface 14 is cleaned using, for example, a wet hydrofluoric (HF) acid etching process, then a layer of dielectric material 302 having a thickness ranging from about 1 Å to about 50 Å is formed on or from epitaxial layer 20. Dielectric layer 302 can be formed by oxidation or deposition techniques. By way of example, dielectric layer 302 is silicon dioxide having a thickness of about 25 Å and is formed by thermal oxidation of epitaxial layer 20. A layer of polysilicon 304 having a thickness ranging from about 10 Å to about 3,000 Å is formed on dielectric layer 302, and may be activated by a thermal anneal ranging from about 900° C. to about 1,075° C. for a time ranging from about 10 seconds to about 100 seconds. A layer of photoresist 306 is formed on polysilicon layer 304 and serves as an implant screen mask. Photoresist layer 306 may be referred to as a mask, an implant mask, or a screen mask.

An impurity material of P-type conductivity is implanted into polysilicon layer 304. By way of example, the impurity material is boron or boron difluoride. A doped region or doped layer 310, which serves as a barrier height adjustment region, is formed in epitaxial layer 20. The barrier height adjustment species, i.e., the impurity material of doped region 310 extends a distance $D_{BA}$ into semiconductor material 12 from surface 14, wherein distance $D_{BA}$ is less than the zero bias depletion region width $Z_{BD}$. By way of example, the zero bias depletion region width $Z_{BD}$ for a 100 volt planar Schottky device is approximately 4,000 Angstroms (Å). In addition to the thickness of doped region 310, the total integrated charge, $Q_D$, of doped region 310, which is given by the integral of the doping concentration of doped region 310 over distance $D_{BA}$, can be approximated as half the product of the peak surface concentration of doped region 310 and distance $D_{BA}$. For some embodiments, the total integrated charge, $Q_D$, of doped region 310 ranges from about $10^9$ atoms/cm$^3$ to about $10^{13}$ atoms/cm$^3$. The zero bias depletion region width may be referred to as a zero bias depletion region boundary or a zero bias depletion boundary. It should be noted that using a masking structure such as photoresist layer 306 is not a limitation of the present invention. For example, the masking step, i.e., photoresist layer 306 and its formation, may be eliminated and the barrier height adjustment implant can be into polysilicon layer 304 using a blanket implant or a blanket deposition technique.

Figure 31:
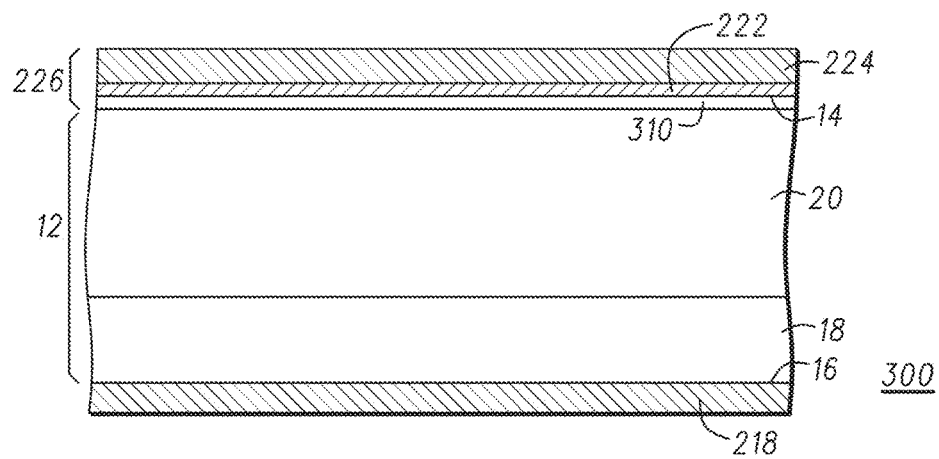
FIG. 31 is a cross-sectional view of the semiconductor component of FIG. 30 at a later stage of manufacture.

Referring now to FIG. 31, photoresist layer 306, polysilicon layer 304, and dielectric layer 302 are removed and a Schottky contact 216 is formed in contact with doped region 310 and a cathode 218 is formed in contact with surface 16 as described with reference to FIG. 23.

Figure 32:
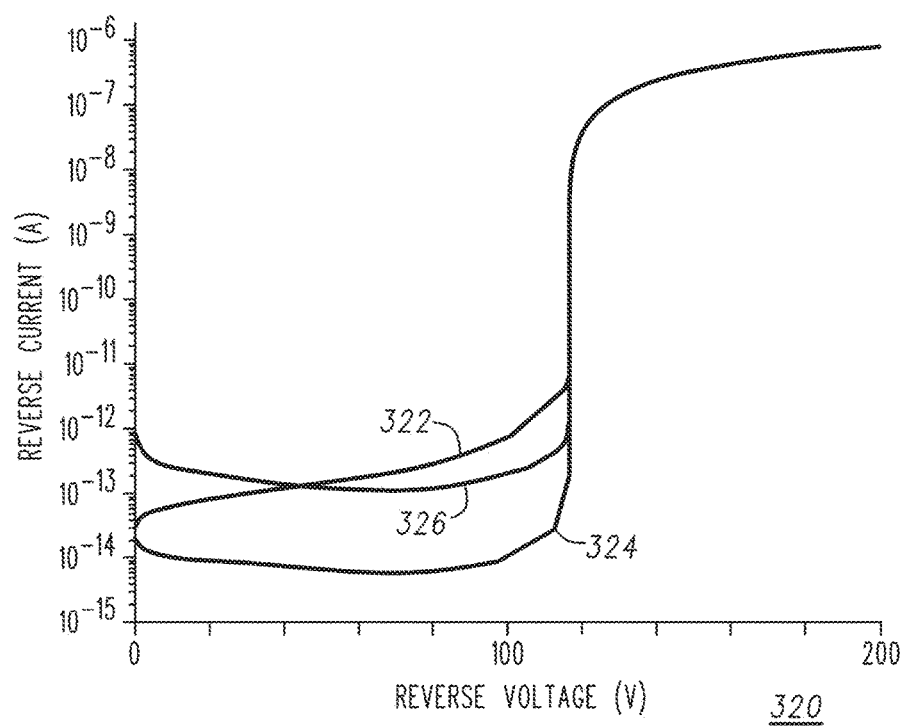
FIG. 32 is a graph illustrating the relationship between reverse current and reverse voltage in accordance with an embodiment of the present invention.

FIG. 32 is a graph 320 illustrating the relationship between reverse current, IR, and an increasing reverse voltage, VR, for a 100 volt trench Schottky device in accordance with an embodiment of the present invention. Plot 322 illustrates the reverse current-reverse voltage relationship for a trench Schottky device without a barrier height adjustment layer and plot 324 illustrates the reverse current-reverse voltage relationship for a trench Schottky device that includes a barrier height adjustment layer in accordance with an embodiment of the present invention. Graph 320 shows that including doped regions such as, for example, doped regions 58, 210, 230, 254, 262, 276, and 310 in at least FIGS. 1, 22, 23, 25, 27, 29, and 31, respectively, decreases the reverse current with increasing reverse voltage because of the barrier height modulation effect. Graph 320 shows that at 100 volts, the leakage current, IR, is decreased by about two orders of magnitude. Plot 326 further shows that including doped regions 58, 210, 230, 254, 262, 276, and 310 lowers the leakage current with increasing reverse voltage.

Figure 33:
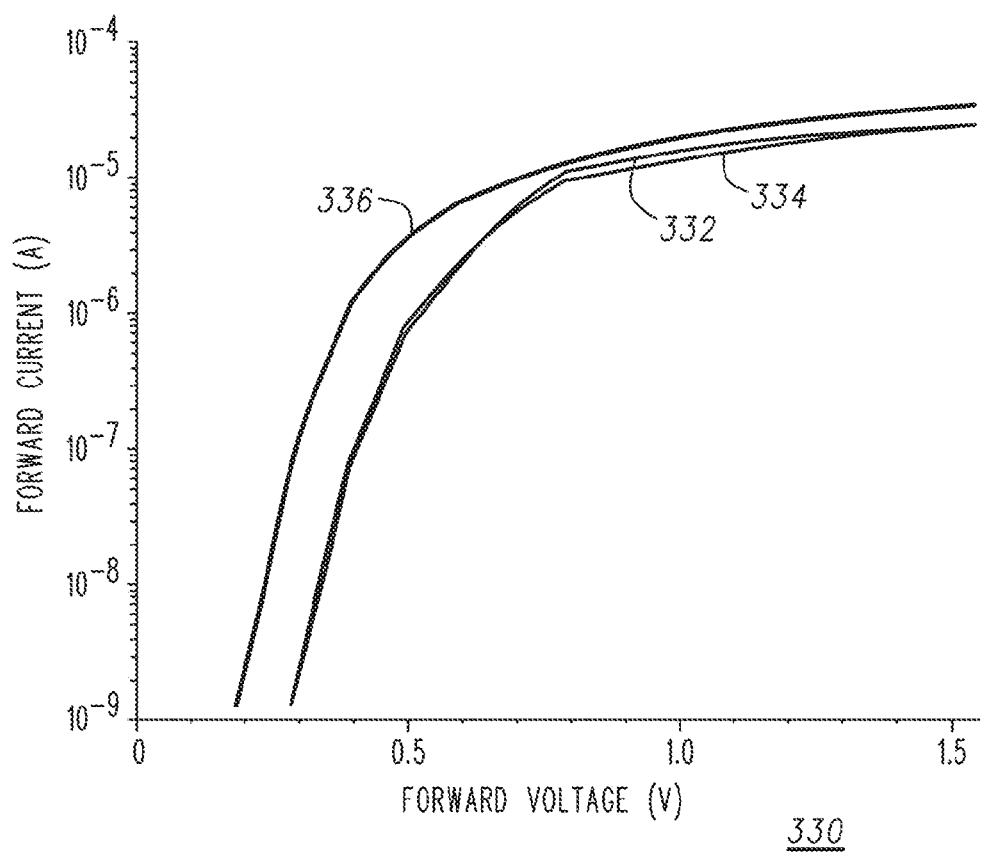
FIG. 33 is a graph illustrating the relationship between forward current and forward voltage in accordance with an embodiment of the present invention.

FIG. 33 is a graph 330 illustrating the relationship between forward current, IF, and increasing forward voltage, VF, for a 100 volt trench Schottky device in accordance with an embodiment of the present invention. Plot 332 illustrates the forward current-forward voltage relationship for a trench Schottky device without a barrier height adjustment layer and plot 334 illustrates the forward current-forward voltage relationship for a trench Schottky device that includes a barrier height adjustment layer in accordance with an embodiment of the present invention. In particular, plots 332 and 334 illustrate that including doped regions 58, 210, 230, 254, 262, 276, and 310 does not appreciably affect the forward voltage characteristics, but lowers the leakage current by at least two orders of magnitude. In addition, plots 326 and 336 illustrate that the reverse current and the forward voltage can be adjusted by adjusting the thickness of the epitaxial layer, adjusting the concentration of the epitaxial layer, adjusting the barrier height of the contact structure, or combinations of these techniques.

By now it should be appreciated that a semiconductor component such as, for example a Schottky device and methods for manufacturing the semiconductor component have been provided. Schottky devices manufactured in accordance with embodiments of the present invention include a doped region or a doped layer such as doped regions 58, 210, 230, 254, 262, 276, and 310 that extends from surface 14 into semiconductor material 12 a distance that is less than the zero bias depletion boundary or the zero bias depletion region. In addition, the total integrated charge, $Q_D$, of each doped region, which is given by the integral of the doping concentration of doped region over distance $D_{BA}$, can be approximated as half the product of the peak surface concentration of a doped region and distance $D_{BA}$. Manufacturing Schottky devices in accordance with embodiments of the present invention lowers the forward voltage and a lowers the reverse leakage current that results from a pinch-off action of the trench-MOS regions, and increases the breakdown voltage of the Schottky devices. FIG. 3 illustrates that the reverse leakage current decreases as the breakdown voltage increases for Schottky devices manufactured in accordance with embodiments of the present invention. FIGS. 31 and 32 illustrate that Schottky devices that include barrier height adjustment layers or regions such as, for example, doped regions 58, 210, 230, 254, 262, 276, and 310 in accordance with embodiments of the present invention have lower leakage currents and lower forward voltage drops.

Although certain preferred embodiments and methods have been disclosed herein, it will be apparent from the foregoing disclosure to those skilled in the art that variations and modifications of such embodiments and methods may be made without departing from the spirit and scope of the invention. It is intended that the invention shall be limited only to the extent required by the appended claims and the rules and principles of applicable law.

What is claimed is:

1. A method for manufacturing a Schottky device, comprising:
   providing a semiconductor material of a first conductivity type having first and second major surfaces;
   forming a plurality of trenches extending from the major surface into the semiconductor material, including forming a first trench having a floor and sidewalls, a dielectric material on the floor and sidewalls and a semiconductor material on the dielectric material; and further including:
   forming a masking element over the first trench;
   forming a barrier height adjustment layer of a second conductivity in the semiconductor material, the barrier height adjustment layer extending from the first major surface into the semiconductor material a distance that is less than a zero bias depletion boundary by forming doped regions in portions of the semiconductor material adjacent the first trench, the doped regions serving as the barrier height adjustment layer;
   removing the masking element; and
   forming an electrically conductive material in contact with the barrier height adjustment layer, wherein the electrically conductive material forms a Schottky contact.

2. The method of claim 1, wherein forming the barrier height adjustment layer of the second conductivity type comprises plasma doping the semiconductor material of the first conductivity type with an impurity of the second conductivity type.

3. The method of claim 2, wherein providing the semiconductor material of the first conductivity type includes providing the semiconductor material as a semiconductor substrate having an epitaxial layer formed thereon.

4. The method of claim 1, wherein forming the plurality of trenches includes forming the plurality of trenches to extend into the semiconductor material a distance that is greater than the zero bias depletion boundary.

5. The method of claim 1, further including forming a second electrically conductive material in contact with the second surface of the semiconductor material of the first conductivity type.

6. The method of claim 1, further including forming the barrier height adjustment layer to have a total integrated charge that is the integral of a doping concentration of the barrier height adjustment layer over the distance that the barrier height adjustment layer extends into the semiconductor material.

7. The method claim 1, wherein forming the Schottky contact includes forming a silicide from a portion of the semiconductor material and forming a layer of electrically conductive material on the silicide.

8. A method for manufacturing a Schottky device, comprising:
providing a semiconductor material of a first conductivity type having first and second major surfaces;
forming a plurality of trenches extending from the major surface into the semiconductor material, wherein forming the plurality of trenches includes forming a first trench having a floor and sidewalls, a dielectric material on the floor and the sidewalls and a semiconductor material on the dielectric material; and further including:
forming a barrier height adjustment layer of a second conductivity in the semiconductor material, the barrier height adjustment layer extending from the first major surface into the semiconductor material a distance that is less than a zero bias depletion boundary by forming doped regions in portions of the semiconductor material adjacent the first trench, the doped regions serving as the barrier height adjustment layer; and
forming an electrically conductive material in contact with the barrier height adjustment layer.

9. A method for manufacturing a Schottky device, comprising:
providing a semiconductor material of a first conductivity type having first and second major surfaces;
forming a Schottky contact in contact with a portion of the first major surface of the semiconductor material of the first conductivity type; and
implanting an impurity material of a second conductivity type after formation of the Schottky contact and through the Schottky contact to form a barrier height adjustment layer of the second conductivity in the semiconductor material, the barrier height adjustment layer extending from the first major surface into the semiconductor material a distance that is less than a zero bias depletion boundary.

10. The method of claim 9, wherein forming the Schottky contact includes:
forming a silicide layer from the semiconductor material; and
forming a layer of aluminum over the silicide layer.

11. The method of claim 9, wherein implanting the impurity material of the second conductivity type through the Schottky contact includes forming the barrier height adjustment layer to have a total integrated charge equal to the integral of a doping concentration of the barrier height adjustment layer over the distance that the barrier height adjustment layer extends into the semiconductor material.

12. The method of claim 9, wherein a dopant profile of the impurity material of the second conductivity type is configured to decrease a reverse current of the semiconductor component with an increasing reverse voltage.

13. The method of claim 9, further including forming a conductor in contact with the second major surface of the semiconductor material of the first conductivity type.

14. A Schottky device, comprising:
a semiconductor material of a first conductivity type having first and second major surfaces;
a first trench extending from the major surface into the semiconductor material, the first trench having a floor and sidewalls, a dielectric material on the floor and sidewalls and a semiconductor material on the dielectric material;
a doped region of a second conductivity type extending from the first major surface a distance that is less than a zero bias depletion boundary, wherein a dopant profile of the impurity material of the second conductivity type is configured to decrease a reverse current of the semiconductor component with an increasing reverse voltage, the doped region serving as a barrier height adjustment structure; and
an electrically conductive material in contact with the barrier height adjustment structure, wherein the electrically conductive material forms a Schottky contact in contact with the doped region.

15. The Schottky device of claim 14, further including a plurality of trenches extending from the major surface into the semiconductor material.

16. The Schottky device of claim 15, wherein the plurality of trenches extend into the semiconductor material a distance that is greater than the zero bias depletion boundary.

17. The Schottky device of claim 16, wherein the plurality of trenches includes a first trench having floor and sidewalls, a dielectric material on the floor and sidewalls and a semiconductor material on the dielectric material.

18. The Schottky device of claim 14, wherein a total integrated charge of the doped region is the integral of a doping concentration of the doped region over the distance that the doped region extends into the semiconductor material.

* * * * *